(12) United States Patent
Azuma et al.

(10) Patent No.: US 8,519,561 B2
(45) Date of Patent: Aug. 27, 2013

(54) POWER MODULE AND VEHICLE-MOUNTED INVERTER USING THE SAME

(75) Inventors: Katsunori Azuma, Hitachi (JP); Mutsuhiro Mori, Mito (JP); Michiaki Hiyoshi, Yokohama (JP); Seiichi Hayakawa, Hitachi (JP); Koji Sasaki, Mito (JP); Isamu Yoshida, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 325 days.

(21) Appl. No.: 12/826,409

(22) Filed: Jun. 29, 2010

(65) Prior Publication Data

US 2010/0327654 A1 Dec. 30, 2010

(30) Foreign Application Priority Data

Jun. 30, 2009 (JP) ................................. 2009-154528

(51) Int. Cl.
*B60R 16/03* (2006.01)
(52) U.S. Cl.
USPC .......................................... 307/9.1; 307/112
(58) Field of Classification Search
USPC .................................. 307/9.1, 112
See application file for complete search history.

(56) References Cited

U.S. PATENT DOCUMENTS

| 5,744,860 A * | 4/1998 | Bayerer ........................ 257/683 |
| 7,589,400 B2 * | 9/2009 | Hozoji et al. .................. 257/673 |
| 2007/0109715 A1 * | 5/2007 | Azuma et al. ............... 361/299.3 |

FOREIGN PATENT DOCUMENTS

| JP | 2002-34268 A | 1/2002 |
| JP | 2007-143272 A | 6/2007 |

* cited by examiner

*Primary Examiner* — Rexford Barnie
*Assistant Examiner* — Haihui Zhang
(74) *Attorney, Agent, or Firm* — Crowell & Moring LLP

(57) ABSTRACT

A power module includes an upper arm circuit unit and a lower arm circuit unit each having a power semiconductor element; an insulating substrate with the units mounted on one surface thereof; a metal base bonded onto the other surface of the substrate opposite to the one surface where the units are mounted; a first connection conductor for supplying a high potential to the upper unit from outside; a second connection conductor for supplying a low potential to the lower unit from outside; an insulating sheet interposed between the conductors; and a resin case disposed on the metal base to support the conductors, the conductors are flat conductors and laminated with the sheet sandwiched therebetween; the sheet extends from one end of the laminated structure to secure the creepage distance between the conductors; and the case is furnished with a recess for containing the laminated structure.

3 Claims, 15 Drawing Sheets

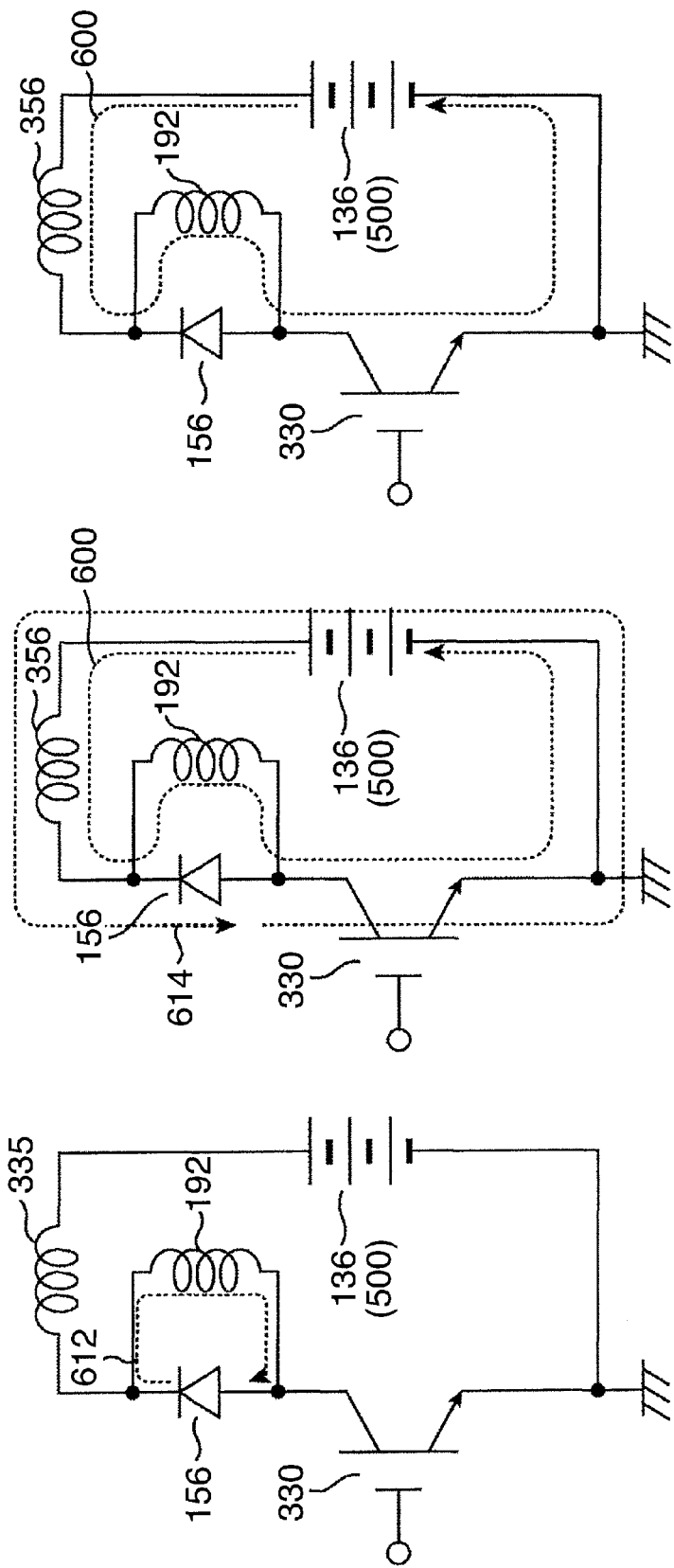

WAVEFORMS OF GATE VOLTAGE 602,
COLLECTOR VOLTAGE 604 AND
COLLECTOR CURRENT 606 WHEN
IGBT 330 TURNS ON

WAVEFORMS OF GATE VOLTAGE 622,
COLLECTOR VOLTAGE 626 AND
COLLECTOR CURRENT 624 WHEN
IGBT 330 TURNS OFF

POWER MODULE AND VEHICLE-MOUNTED INVERTER USING THE SAME

BACKGROUND OF THE INVENTION

This invention relates to a power module and a vehicle-mounted inverter using the power module, and more particularly to a power module having the function of switching and a vehicle-mounted inverter that uses this power module and converts the DC power of the battery into AC power to control the motor which drives the vehicle.

In general, the inverter has the function of converting the DC power supplied from a DC power source into AC power to be supplied to such an AC load as an electric rotary machine, or the function of converting the AC power generated by the electric rotary machine into DC power to be fed back to the DC power source.

The inverter, which fulfills such power conversion functions as described above, includes an inverter circuit composed mainly of semiconductor switching elements. The inverter circuit performs electric power conversion from DC power into AC power or from AC power to DC power, by turning on and off the semiconductor switching elements.

Usually, the interruption of current due to the turnoff of the semiconductor switching elements gives rise to spike-shaped voltages as a result of transient phenomenon caused by the parasitic inductance distributed throughout the circuit. In order to suppress such spike voltages, it is required to provide a smoothing capacitor in the circuit and to reduce the parasitic inductance of the DC circuit. JP-A-2002-34268 discloses a technique to suppress spike voltages by reducing circuit-distributed parasitic inductance. According to JP-A-2002-34268, the parasitic inductance is reduced by shortening the length of wiring conductors connecting the smoothing capacitor and the semiconductor switching elements so that the surging voltages can be suppressed.

The inverter mounted on a vehicle receives DC power from the DC power source mounted on the vehicle and converts the DC power into 3-phase AC power to be supplied to, for example, the electric rotary machine to drive the vehicle. There has recently been an increasing demand for the vehicle-mounted, electric rotary machine of the present day to generate greater torque as compared with the vehicle-mounted, electric rotary machines in their early stage of appearance. To meet such a demand, the vehicle-mounted inverters tend to perform the conversion of ever increasing power.

The inverter mounted on a vehicle is usually operated in a high-temperature environment as compared with an ordinary inverter used for power conversion in industrial machinery operating in a factory. Therefore, it is required for the vehicle-mounted inverter to reduce as much heat generated by itself as possible. Of the heat generated by the vehicle-mounted inverter itself, the greatest portion is the heat generated by the semiconductor switching elements included as main parts in the inverter circuit. Thus, it is strongly desirable to reduce as much heat generated by the switching elements as possible.

With the switching elements mentioned above, the generation of heat increases at the time of change from turn-on to turn-off or from turn-off to turn-on. It is therefore desirable to reduce the heat generation at the time of switching. The first solution to reduce such heat generation is to shorten the time of switching in each switching element.

Further, the second solution to the reduction of the overall heat generation is to prolong the time interval at which the switching elements perform switching actions, that is, to reduce the number of switching operations per unit time. However, too long an interval at which the switching operations take place, may incur a poor precision in control. Therefore, there is a restriction on the extent to which the number of switching operations per unit time is largely decreased.

JP-A-2007-143272 discloses a technique according to which the time required for the switching action of each switching element in the inverter circuit is shortened by reducing the parasitic inductance so that the heat generation per single switching action can be decreased.

In addition to the technique disclosed in JP-A-2002-034268, there has recently been an increasing demand for further decreasing heat generation by decreasing parasitic inductance.

JP-A-2007-143272 discloses the fact that the reduction of parasitic inductance results in the reduction of heat generation per single switching action of each switching element and the technique for reducing parasitic inductance. However, since the vehicle-mounted inverter is usually disposed in a tight space, it must generate less heat and be made smaller in size.

In general, as the amount of power converted by an inverter increases, the size of the inverter tends to increase. Despite this, however, the vehicle-mounted inverter must be built in as small a size as possible even though it must handle an increasing amount of power. For example, it is necessary to devise an artifice for increasing the value of the maximum convertible power per unit volume of inverter.

For this purpose, the reduction of parasitic inductance needs to be compatible with the reduction of size. Here, it should be understood that the reduction in size means to increase the value of the maximum convertible power per unit volume of inverter to the greatest extent possible. Further, the use of low-inductance wiring layout helps decrease the heat generation by each switching element so that the area of semiconductor substrate occupied by each switching element can be decreased, whereby the size of the resulting inverter can be reduced. The realization of small size and low cost helps promote the dissemination of the resulting inverters, and hence the energy conservation and environmental protections.

SUMMARY OF THE INVENTION

A first object of this invention, which has been made from the viewpoint described above, is to provide a power module having low parasitic inductance and being small in size while securing the stability of insulation in the inverter.

A second object of this invention is to provide a vehicle-mounted inverter using the power module described above, having low parasitic inductance and being small in size.

The power module of this invention, designed to attain the first object as mentioned above, includes an upper arm circuit unit and a lower arm circuit unit both including the same number of power semiconductor elements; an insulating substrate with an upper arm circuit unit and a lower arm circuit unit mounted on one surface thereof; a metal base bonded onto the other surface of the insulating substrate which is opposite to the one surface where the upper and lower arm circuit units are mounted; a first connection conductor for supplying a high potential to the upper arm circuit unit from outside; a second connection conductor for supplying a low potential to the lower arm circuit unit from outside; an insulating sheet interposed between the first connection conductor and the second connection conductor; and a resin case disposed on the metal base to support the first and second connection conductors, wherein the first and second connection conductors are flat conductors and laminated with the insulating sheet sandwiched between them; the insulating sheet extends from one end of the laminated structure so as to serve as creepage distance between the first and second connection conductors; and the resin case is furnished with a recess for containing the laminated structure of the first and second connection conductors and the insulating sheet.

The vehicle-mounted inverter of this invention, designed to attain the second object, incorporates therein a power module and a capacitor module having such structures as described above, and includes a laminated bus bar consisting of two conductor plates and an insulating sheet sandwiched therebetween and connecting the power module and the capacitor module electrically; wherein the peripheral ends of the two conductor plates are provided with connecting portions, respectively; one of the first and second connection conductors of the power module is disposed close to and connected with, one of the two conductor plates; and the laminated bus bar is disposed over one of the first and second connection conductors of the power module when they are electrically connected with each other, so that the insulating sheet of the laminated bus bar overlaps that portions of the insulating sheet which lie between the connection lugs of the first and second connection conductors, in the direction perpendicular to the surface of the laminated bus bar.

With these structures described above, the parasitic inductance distributed from the power module through the capacitor module can be reduced to an appreciable extent.

According to this invention, the parasitic inductance in the power module can be reduced and the volume of the power module can also be reduced. Further, if the power module of this invention is used in a vehicle-mounted inverter, the parasitic inductance and volume of the inverter can also be reduced. Moreover, this invention employs the low-inductance layout of wiring conductors so that heat generation by each switching element can be reduced. Accordingly, the area occupied on semiconductor substrate by each switching element can be reduced and therefore the size and the cost of the resulting power module can be reduced, too.

The modes of practice of this invention described below can achieve the effect of reducing parasitic inductance, the effect of reducing the overall volume, and some advantages in manufacturing electronic products. These effects and advantages will be described in what follows.

In addition to the effects and the advantages described above, other effects and advantages will be attained, and various problems associated with the commercialization of products will be solved, according to the following modes of practice of this invention. However, the detailed description of the modes of practice of this invention with reference to the attached drawings will here be preceded by the discussion of the typical examples of technical problems to be solved, the results obtainable when such problems have been solved, and the general idea of techniques for solving such problems.

[Description Regarding Reduction of Inductance]

There are three ideas in reducing the parasitic inductance associated with the electric circuits in question.

The first idea is to reduce the parasitic inductance associated with the power module, the second idea is to reduce the parasitic inductance associated with the capacitor module, and the third idea is to reduce the parasitic inductance associated with the connecting circuit that electrically connects the power module with the capacitor module. It is most preferable to realize all the three ideas at a time. However, it is still desirable to put only one of the three ideas into practice and it is much more fruitful to practice two of them.

The first idea of reducing the parasitic inductance associated with the power module will first be explained. The power module incorporates therein the chip of semiconductor elements used in the inverter circuit and is provided with the DC terminal for the supply and reception of DC power. The DC conductor between the DC terminal and the semiconductor elements is in the form of lamination composed of a positive-polarity conductor plate, a negative-polarity conductor plate and an insulating material sandwiched between them.

By employing this laminated structure, the parasitic inductance distributed in the electric circuit connecting the DC terminal with the semiconductor elements can be reduced to a great extent. Further, by using an insulating sheet as the insulating material, the distance between the positive-polarity connection conductor and the negative-polarity connection conductor can be diminished. The resin case is provided with a recess for determining the positions of the conductors. A portion of the lamination is contained in the recess. One end of the insulating sheet extends out of the lamination and touches the inner wall of the recess. By checking the extended portion of the insulating sheet, the creepage distance between the positive-polarity connection conductor and the negative-polarity connection conductor can be secured. With this structure, the reliability in insulation and the reduction of inductance can be compatible with each other.

The second idea of reducing the parasitic inductance associated with the capacitor module will then be explained. In the capacitor module, plural capacitor cells are disposed in parallel on the lamination of conductors having a positive-polarity conductor plate and a negative-polarity conductor plate. The electrodes on both sides of each capacitor cell are electrically connected with the positive- and negative-polarity conductor plates, respectively. With this structure, the parasitic inductance in the capacitor module can be reduced. In the mode of practice of this invention described later, the lamination of the positive- and negative-polarity conductor plates extends out of the capacitor module to serve as the DC terminal for the capacitor module. With this structure, the parasitic inductance can be reduced.

Further, by continuously extending the insulating sheet interposed between the positive- and negative-polarity conductor plates from inside to the outside connection ends, the wiring configuration of lamination extending from inside to outside can be realized so that this wiring configuration leads to the reduction of parasitic inductance in the wiring layout. Moreover, the insulating sheet is bent at the connecting ends, and a terminal guide is provided in the external case for the capacitor so as to determine the position of the insulating sheet and to prevent the position of the insulating sheet from being dislocated at the time of assembling the inverter. With this structure, the stability of insulation after assembling can be secured and also low parasitic inductance can be realized.

The third idea of reducing the parasitic inductance associate with the connecting circuit for connecting the power module with the capacitor module will now be explained. According to this third idea, the connecting circuit is built in a laminated structure wherein a positive-polarity conductor plate and a negative-polarity conductor plate sandwich an insulating member therebetween. Further, the connecting terminal portions of the connecting circuit are also in the same laminated structure. As a result, the parasitic inductance is reduced. Moreover, since the insulating member is an insulating sheet, the distance between the positive-polarity conductor plate and the negative-polarity conductor plate becomes small so that the associated parasitic inductance is reduced. That portion of the insulating sheet of the first lamination serving as the external connection conductor for capacitor which protrudes out of the first lamination overlaps that portion of the insulating sheet of the second lamination serving as the DC conductor which protrudes out of the second lamination. As a result, the reliability of insulation in the inverter as a whole can be secured and the associated parasitic inductance can also be reduced.

With these structures described above as the first through third ideas, the parasitic inductance of the circuit in the power module can be reduced.

[Description Regarding Reduction of Size of Inverter Device]

Description will now be made of how to reduce the size of the power module. The power module described below has the same structure as the power module described above. The power module includes three series circuits constituting the upper-arm and lower-arm of the inverter circuit, the three series circuits corresponding to the U-, V- and W-phases of 3-phase AC power. Since the three series circuits are designed to be disposed close to one another, the semiconductor chips containing the respective series circuits can also be disposed neatly close to one another. This layout of the semiconductor chips leads to the reduction of size of the power module.

In a mode of practice of this invention, as described later, the semiconductor elements constituting an inverter circuit are disposed on a metal plate for heat dissipation with an insulating layer interposed between the semiconductor elements and the insulating layer, and a DC conductor for supplying DC power to the power module is disposed over the semiconductor elements. Namely, the metal plate for heat dissipation is provided on one side of the semiconductor elements whereas the DC conductor is provided on the other side of the semiconductor elements. With this structure, the size of the power module can be reduced and hence the size of the inverter as a whole can be reduced, too.

While this invention can solve the above mentioned problems, attain the above mentioned objects and achieve the above mentioned advantages as described above, the following modes of practice of the invention can also solve other problems and achieve other new advantages.

The other objects and methods of achieving the objects will be readily understood in conjunction with the description of embodiments of the present invention and the drawings.

BRIEF DESCRIPTION OF THE DRAWINGS

FIGS. 12A, 12B and 12C show the relevant portion of the series circuit consisting mainly of the upper-arm IGBT and the lower-arm IGBT, in which the dotted arrows indicate the current that flows as time elapses when the lower-arm IGBT turns on;

DETAILED DESCRIPTION OF THE EMBODIMENTS

Inverters according to the modes of practice of this invention will now be described in reference to the attached drawings. A vehicle-mounted inverter, which is applied to a hybrid automobile, is exemplified as a typical embodiment of this invention.

The modes of a practice of the invention find its best application in vehicle-mounted inverters for use on automobiles or trucks, but can also be applied to many other inverters such as, for example, investors mounted on electric trains, ships or aircraft; inverters of industrial use to be used for controlling electric motors to drive factory facilities; or inverters of domestic use to be used as controllers for home-use solar generation system or electric appliances.

Figure 1:
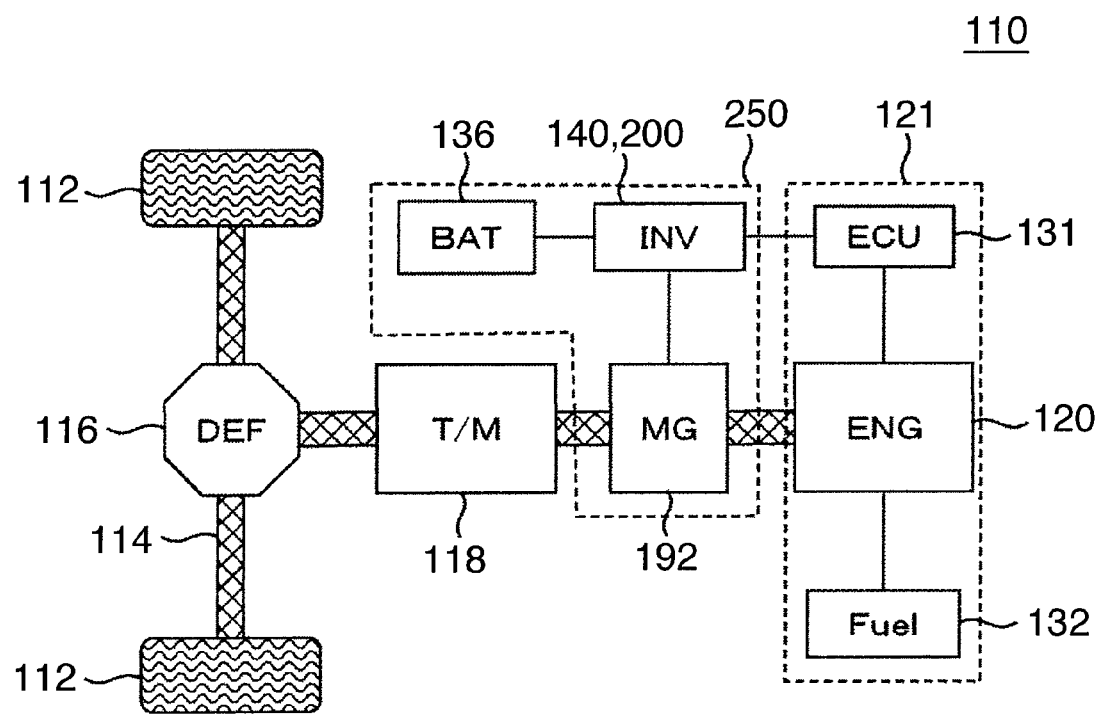
FIG. 1 schematically shows in block diagram the energy transfer path of a hybrid automobile using an inverter according to a first mode of practice of this invention.
Figure 2:
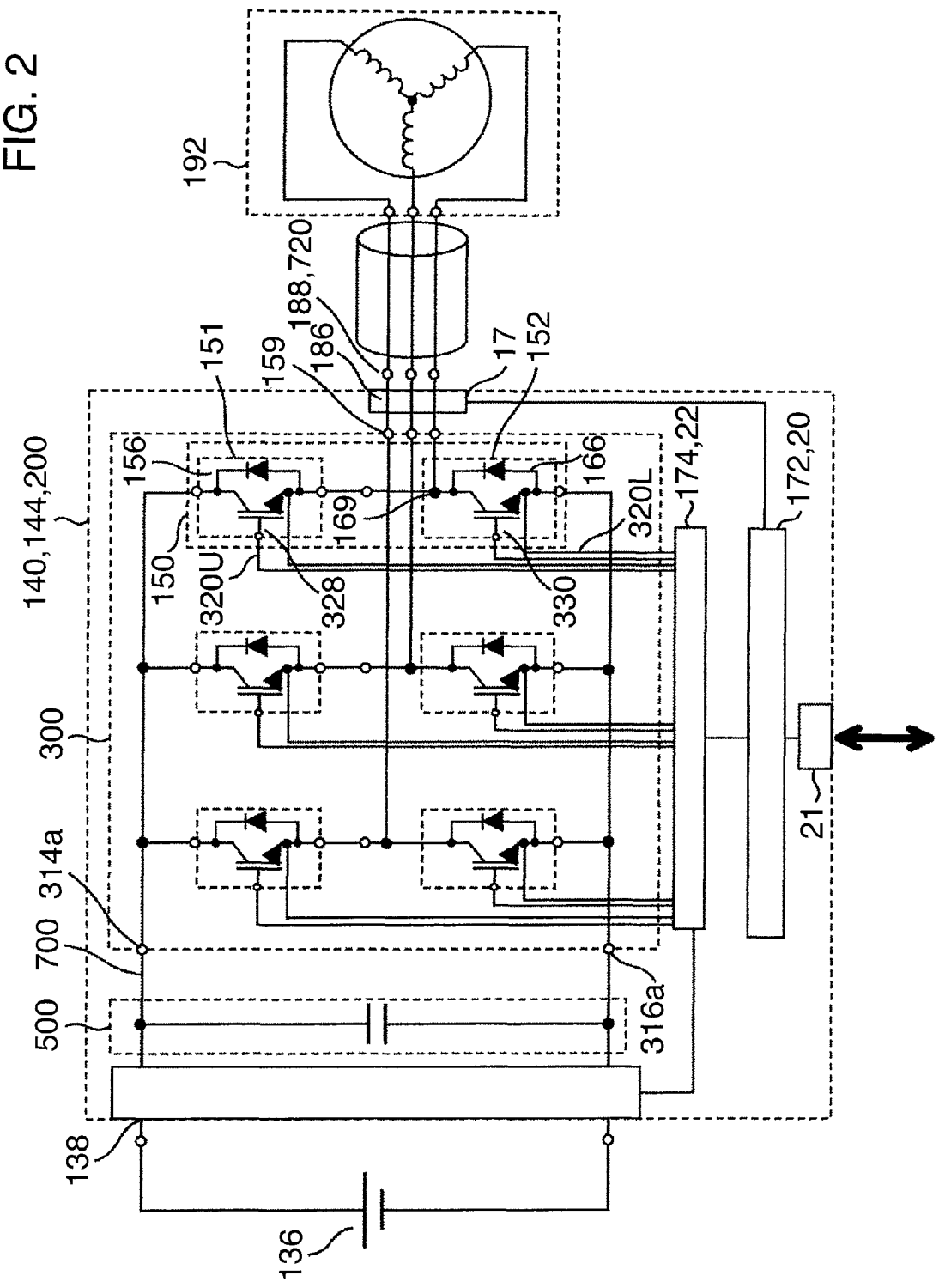
FIG. 2 illustrates the circuit configuration of an inverter according to the first mode of practice of this invention.

FIG. 1 schematically shows in block diagram the energy transfer path of a hybrid automobile using an inverter according to the first mode of practice of this invention. FIG. 2 illustrates the circuit configuration of an inverter according to the first mode of practice of this invention.

The vehicle-mounted inverter according to the first mode of practice of this invention is usually used in a stern operating or mounting environment. In general, such a vehicle-mounted inverter serves not only as a controller for controlling the electric motor to drive the vehicle but also as a controller for controlling the operation of the electric motor by converting into predetermined AC power the DC power supplied from a vehicle-mounted battery or a vehicle-mounted generator.

The electric motor also has the function of a generator, and generates electric power when the vehicle is decelerated in the running mode. The vehicle-mounted inverter converts the generated AC power into DC power, which is used to charge the vehicle-mounted battery.

A hybrid electric car (hereafter referred to as HEV for short) 110 shown in FIG. 1 is furnished with two driving systems. One is an engine system 121 using as a motive power an internal combustion engine 120 fed with fossil fuel or hydrogen fuel. In the engine system 121, an engine control unit (ECU) 131 controls the engine 120, the engine 120 drives the vehicle through the combustion of fuel 132 and also transfers motive force to an inductance 192. The other is a vehicle-mounted electric machine system 250 using the electric power from the battery as a source of energy and the inductance 192 as a source of motive power. These two systems exchange information on the rpm of the engine and the torque commands and efficiently perform the generation of regenerated energy in the time of braking or the augmentation of torque in the region of low rpm's for the economy of fed fuel. The inductance 192 is a synchronous machine or an induction machine, which can operate as a motor or a generator depending on the mode of operation and therefore is referred to herein as a motor-generator.

A front wheel axle 114 is supported rotatably in the front part of the vehicle chassis. A pair of front wheels 112 are provided at the ends of the front wheel axle 114. A rear wheel axle (not shown) is supported rotatably in the rear part of the vehicle chassis. A pair of rear wheels are provided at the ends of the rear wheel axle. The HEV of this mode of practice employs the so-called "front-wheel drive mechanism" where the front wheels 112, which are driven by the motive force, are regarded as the principal wheels while the rear wheels, which follow the rotation of the front wheels, are regarded as auxiliary wheels. However, it is a matter of course that the HEV of this mode of practice may employ the reverse mechanism, i.e. rear-wheel drive mechanism.

A front-wheel side differential gear 116 (hereafter referred to as "front-wheel DIF") is provided in the middle of the front-wheel axle 114. The front-wheel axle 114 is mechanically coupled to the output end of the front-wheel DIF 116. The input end of the front-wheel DIF 116 is mechanically couple to the output axle of a transmission 118. The front-wheel DIF 116 is the differential motive-force distribution mechanism which distributes to the left and right front wheels the rotary drive force transferred from the transmission 118. The input end of the transmission 118 is mechanically coupled to the output end of the inductance 192.

In this mode of practice, the inductance 192 is a synchronous machine having the rotor of permanent magnet. The drive of the inductance 192 is controlled by controlling the AC power supplied to the armature winding of the stator by means of an inverter device 140. The inverter device 140 is connected to a battery 136 and electric power can be reciprocated between them.

The inverter device 140 converts DC power to AC power through switching. In order to supply surge current required in time of switching, a capacitor module is located close to and connected with, a power module as will be described later. The inverter device and the capacitor module generate heat in time of switching and due to copper loss (caused by electric resistance). It is therefore desired to reduce heat generation and to enhance cooling capacity so as to reduce the volume and the cost of the inverter.

According to the inverter described below, the inverter device 140 can be realized in which copper loss is reduced and cooling capacity is improved.

FIG. 2 shows the circuit configuration of the inverter device 140. As shown in FIG. 2, the inverter device 140 comprises a power module 300 and a driver circuit 174 which switches on and off the IGBTs (Insulated Gate Bipolar Transistors) of the power module 300 in response to the gating signals supplied from a microcomputer PCB 172. Here, The reference numerals 20,21,138,188 indicate a microcomputer circuit substrate, a connector, a DC (direct current) connector and an AC (alternative current) connector, respectively.

The driver circuit 174 is installed in the inverter device 140 and also disposed over and near the power module 300. In this way, signal lines between the inverter device 140 and the driver circuit 174 can be shortened so that the switching noise generated by the IGBTs can be prevented from being picked up by the signal lines. Consequently, the inverter device 140 can be prevented from operating erroneously.

In this mode of practice, the power module 300 comprises the upper arm group of IGBTs 328 which provide connection to a high potential when turned on, with the associated diodes 156 and the lower arm group of IGBTs 330 which provide connection to a low potential when turned on, with the associated diodes 166. The IGBTs 328 with the diode 156, belonging to the upper arm and the IGBTs 330 with the diode 166, belonging to the lower arm, are connected in series with each other. The middle point 169 of the series circuit is connected via the AC bus bar 186 with the winding of a phase, for example, the U-phase, of a three-phase induction motor. As apparent from FIG. 2, there are three such series circuits and therefore three such middle points connected via the AC bus bar 186 with the three-phase windings of the inductance, i.e. three-phase induction motor, 192.

In this mode of practice, description has been made regarding the HEV using the engine system 121 and the vehicle-mounted electric machine system 250 in combination. However, it will be apparent to those killed in the art that this invention is not limited to the above described mode of practice alone but may be applied to a HEV which is furnished with a terminal box containing a converter for supplying electric power to the vehicle from outside the vehicle so as to charge the battery from outside, or a vehicle which uses only a vehicle-mounted electric machine system and dispenses with an engine system and which is furnished with a connection unit for supplying electric power to the vehicle from outside the vehicle.

Further, this invention can be applied also to a vehicle which uses only a vehicle-mounted electric machine system without an internal combustion engine system and which is furnished with a fuel cell, or a vehicle which is furnished with a fuel cell (that directly converts a fuel such as hydrogen supplied from outside into electricity) and a rechargeable battery connected in parallel with the fuel cell and having a connection unit through which external electric power is supplied to the battery.

As shown in FIG. 2, the IGBTs 328, 330 remain non-conductive when no control voltages are applied to their control terminals, i.e. gates, 320U and turn conductive when control voltages are applied to their gates. The diodes 156, 166 are connected in inverse-parallel with the IGBTs 328, 330, respectively, so as to allow currents to flow through them in the direction opposite to that of the current through the IGBTs 328, 330. By virtue of these inverse-parallel paths, there exists a circuit within the inverter through which current flows even while the IGBTs 328, 330 are non-conductive. Accordingly, continuous current can flow through the motor. In the case where the IGBTs 328, 330 are replaced by MOSFETs (metal-oxide semiconductor field-effect transistors), such inverse-parallel diodes can be eliminated, since the MOSFETs can draw current in the reverse direction if the gate electrodes are reversely biased.

As shown in FIG. 2, AC voltages are obtained at the middle points between the upper and lower arms and the AC voltages are supplied via AC terminals 159 to the inductance 192. With this circuit configuration, when the IGBTs 328 of the upper arm turn on, voltages of positive polarity are supplied, whereas voltages of negative polarity are supplied when the IGBTs 330 of the lower arm turn on. In this way, the voltages of positive and negative polarities in pulse form are applied to the AC terminals of the motor-generator. Then, three-phase AC currents flow through the three-phase windings of the motor-generator in accordance with the pulse widths of the pulse-form voltages. By changing the pulse widths, the power supplied to the motor-generator and therefore the torque generated by the motor-generator can be controlled. This procedure of control is called "PWM" (pulse width modulation) control.

As shown in FIG. 2, the capacitor module 500 is disposed between the power module 300 and the battery 136 and supplies instantaneous current at the time of switching in the power module 300. For this purpose, the capacitor module 500 is located very close to the power module 300 in the inverter device 200. As described later, the electric energy stored in the parasitic inductance distributed through the closed circuit consisting of the capacitor module 500, the upper arm circuit unit 151 and the lower arm circuit unit 152 in the power module 300, is supposed on the switching loss in the power device. According to this mode of practice, proposed are wiring layout and connection structure which can reduce this sort of parasitic inductance.

In FIG. 2, a microcomputer PCB 172 carries a microcomputer that calculates the switching timing of the IGBTs 328, 330. The microcomputer has as its input information the target torque to be generated by the inductance 192, the current to be supplied to the armature windings of the inductance 192 and the positions of the magnetic poles of the rotor of the inductance 192.

The value of the current detected by a current sensor incorporated in an AC terminal case 17 is fed back to the microcomputer PCB 172. The position of a particular magnetic pole is detected by a rotary magnetic pole sensor (not shown) incorporated in the inductance 192 and then the detected information is fed back to the microcomputer PCB 172.

The microcomputer generates pulse-width-modulated (PWM) waves through the comparison between the fundamental waves (sinusoidal waves) based on the voltage commands for the U-, V- and W-phases and the carrier wave (triangular wave). Then, the microcomputer delivers the PWM signals to the driver circuit 174.

When the driver circuit 174 is to drive the IGBTs 330 of the lower arm, it first amplifies the PWM signals and then applies the amplified PWM signals as driving signals to the gates of the respective IGBTs 330. On the other hand, when the driver circuit 174 is to drive the IGBTs 328 of the upper arm, it first shifts the reference levels of the PWM signals up to the reference levels for the upper arm, then amplifies the level-shifted PWM signals, and finally applies the amplified, level-shifted PWM signals as driving signals to the gates of the respective IGBTs 328. Accordingly, the IGBTs 328, 330 are subjected to switching operations in response to the driving signals.

The microcomputer PCB 172 and the driver circuits 174 shown in FIG. 2 not only drive the IGBTs but also detect abnormalities (excessive current, excessive voltage and too high temperatures) to protect the power module 300. For this purpose, sensor-based information is inputted into the control unit 170. For example, in order to detect excessive current, IGBTs furnished with specific emitter electrode terminals (not showed) for detecting excessive current are installed; the emitter electrode terminals are connected with the respective arm driving circuits (ICs) (not shown) in the driver circuit 174; and the arm driving circuits (Ics) detect excessive current.

In order to detect too high temperatures, the temperature information obtained by a temperature sensor (not shown) incorporated in the power module is inputted to the driver circuit or the microcomputer PCB. When too high a temperature is detected, the protective operation is performed where some or all IGBTs are turned off, or the motor output is decreased.

Figure 3:
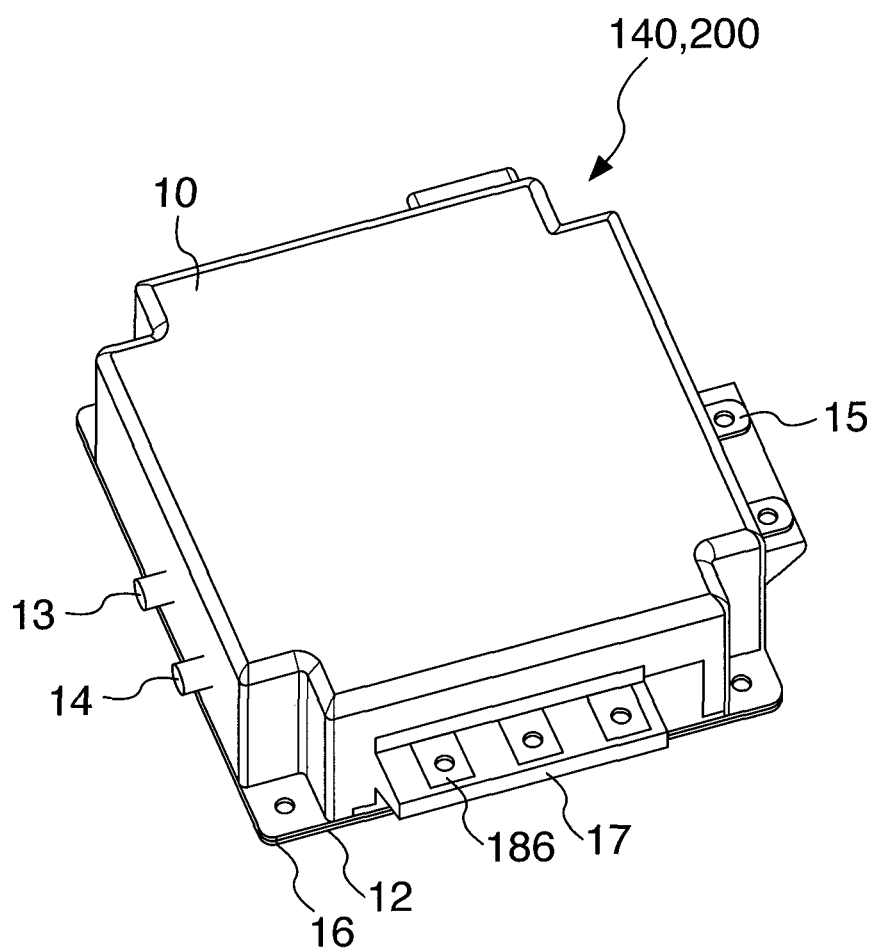
FIG. 3 shows in perspective view the outer appearance of the inverter device as a whole.
Figure 4:
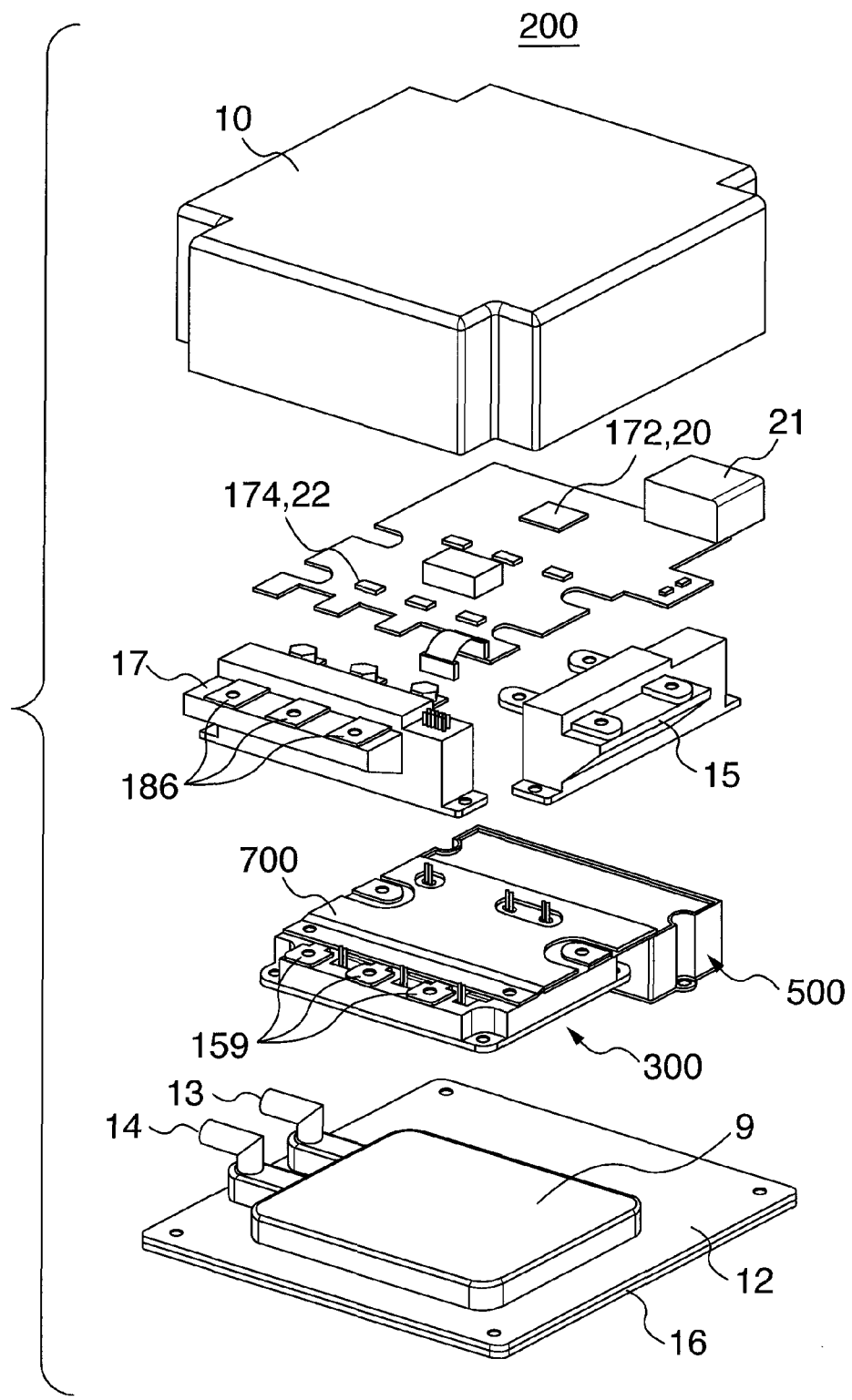
FIG. 4 shows in exploded, perspective view the main parts of the inverter device according to the first mode of practice of this invention.

The outer appearance of the inverter device 200 shown in FIGS. 1 and 2 will now be described in detail with reference to FIGS. 3 and 4. In FIGS. 3 and 4, like reference numerals are used to indicate like elements as in FIGS. 1 and 2.

FIG. 3 shows in perspective view the outer appearance of the inverter device 200 as a whole. As shown in FIG. 3, the inverter device 200 is housed in a casing 12 having a quasi-rectangular bottom surface. The tubing (entrance port 13 and exit port 14) for water that cools the inverter device 200, and an AC terminal case 17 and a DC terminal case 15 are all provided in the side surfaces of the casing. Namely, all the mechanical and electrical connection interfaces are disposed on the side walls of the casing. Here, the reference numerals 10,16 indicate an upper case cover and a lower case cover, respectively.

FIG. 4 shows in exploded, perspective view the main parts of the inverter device according to this mode of practice of this invention.

As shown in FIG. 4, the power module 300 is disposed on the casing 12 having a cooling water channel. A driver circuit PCB 22 carrying the driver circuit 174 thereon is disposed on a conductor 700 for connecting the capacitor with external circuit, the conductor 700 being on top of the power module 300. With this constitution, the control wiring between the power module 300 and the driver circuit PCB 22 can be shortened so that the switching noise from the power module 300 can be shielded by the conductor 700 to avoid the erroneous operation of the power module. Here, the reference numerals 9,10,16,21 indicate a cooler, an upper case cover, a lower case cover and a connector, respectively.

Figure 5A:
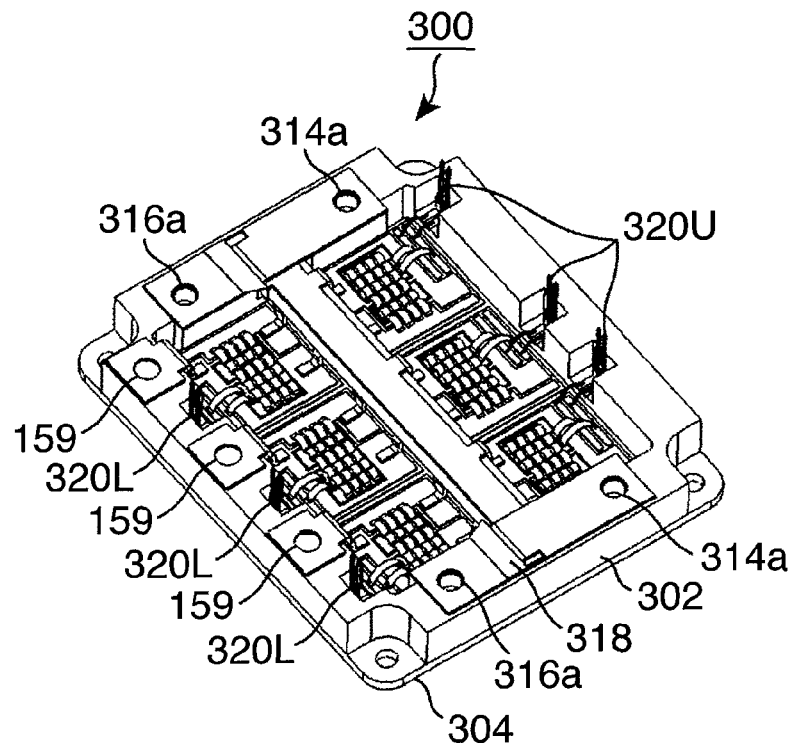
FIG. 5A shows in perspective view the outer appearance of the power module (semiconductor device) according to the first mode of practice of the invention.
Figure 5B:
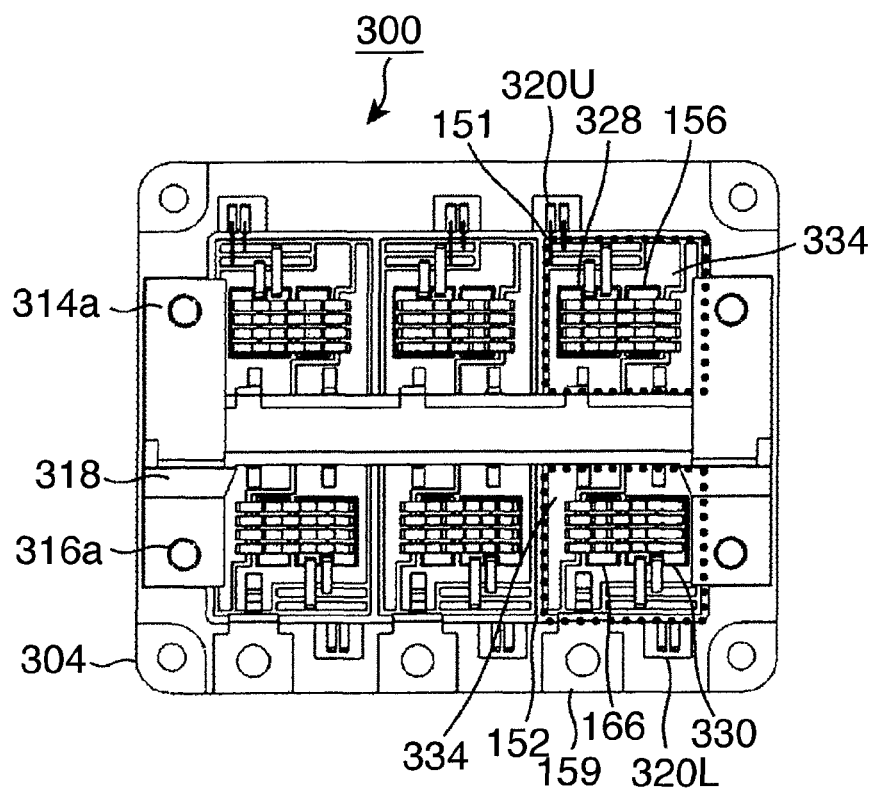
FIG. 5B is a top new of the same power module as shown in FIG. 5A.
Figure 6:
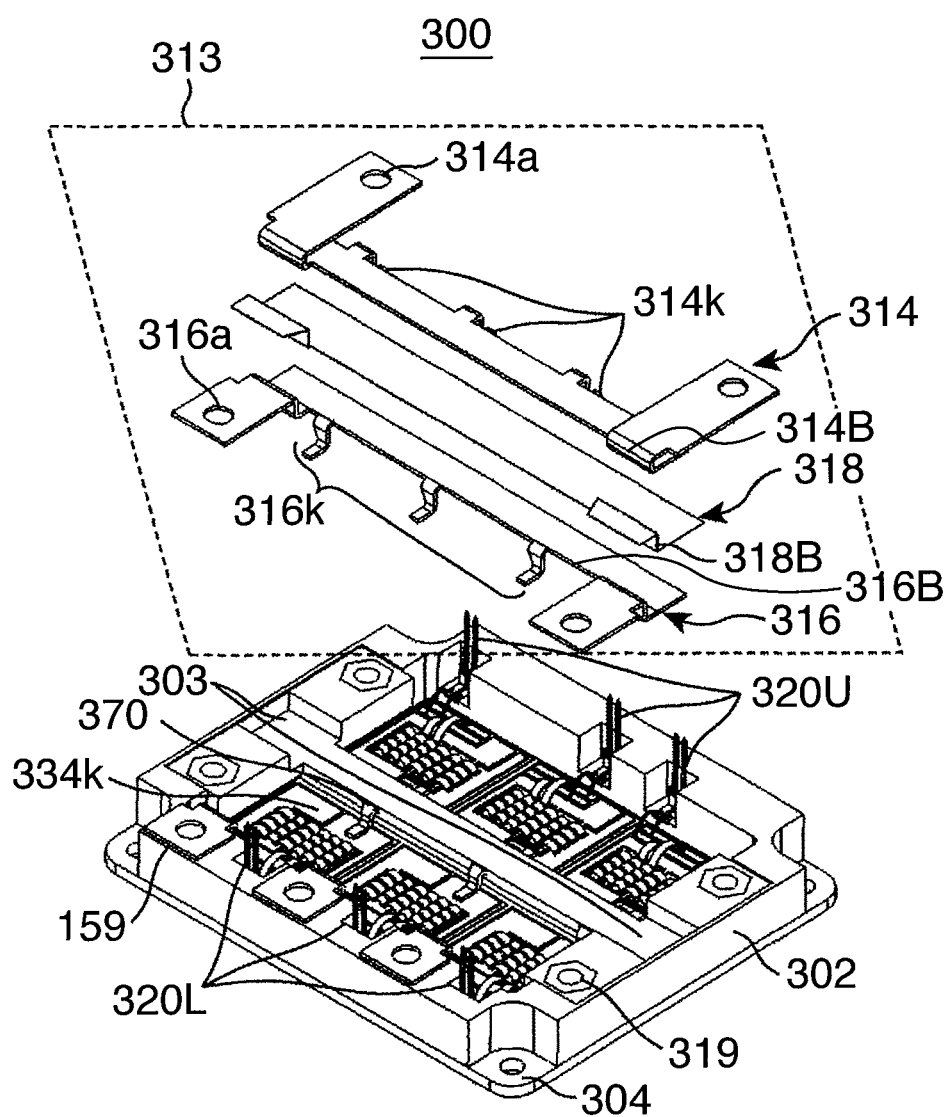
FIG. 6 shows in perspective, exploded view the DC terminal of the power module (semiconductor device) according to the first mode of practice of the invention.

FIG. 5A shows in perspective view the outer appearance of the power module (semiconductor device) according to this mode of practice of the invention, and FIG. 5B is a top new of the same power module as shown in FIG. 5A. FIG. 6 shows in perspective, exploded view the DC terminal of the power module (semiconductor device) according to this mode of practice of the invention.

Figure 7:
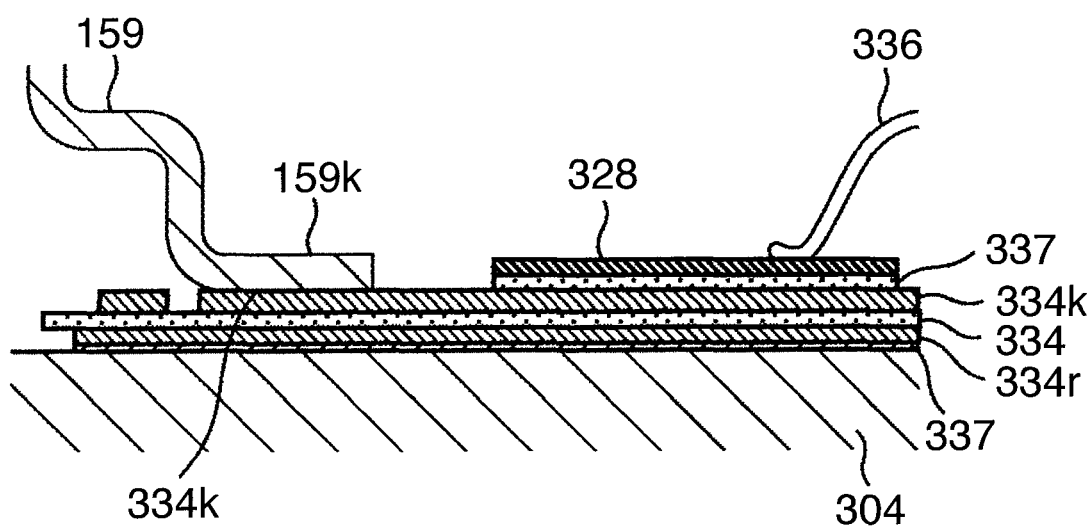
FIG. 7 is a vertical cross-section of the internal portion of the power module.

FIG. 7 is a vertical cross-section of the internal portion of the power module. In these figures, reference numeral 300 indicates the power module, 302 a resin case, 304 a metal base, 305 a fin (see FIG. 7), 314 a connection terminal of positive polarity, 316 a connection terminal of negative polarity, 318 insulating paper (see FIG. 6), 320U/320L control terminals of the power module, 328 the IGBTs of the upper arm, 330 the IGBTs of the lower arm, 156/166 diodes, 334 an insulating substrate (see FIG. 7), 334k the circuit pattern on the upper surface of the insulating substrate (see FIG. 7), and 334r the circuit pattern on the lower surface of the insulating substrate (see FIG. 7).

The power module 300 can be divided largely into, for example, three parts: one is the semiconductor module including wirings in the raising case 302; another is the metal base 304 made of metal such as, for example, Cu, Al or AlSi; and the other is the group of terminals (positive-polarity connection terminals 314 and control terminals 320U) for making connections with the external circuits. The power module 300 has terminals for connection with the external circuits such as the AC terminals to be connected with the U-, V- and W-phase windings of the motor, and the positive-polarity connection terminal 314 and the negative-polarity connection terminal 316, to be connected with the capacitor module 500.

In the semiconductor module, the IGBTs 328, 330 of the upper and lower arms and the diodes 156/166 are disposed on the insulating substrate 334 and covered with resin or silicon gel (not shown). The insulating substrate 334 may be a ceramic substrate or a thin insulating sheet.

On one surface of the metal base 304 is fixedly disposed the insulating substrate 334, on which is disposed a solder layer 337, on which are fixedly disposed the IGBTs 328 of the upper arm with the associated diode chips 156 and the IGBTs 330 of the lower arm with the associated diode chips 166. The connection portion 336 for coupling to outside may be provided thereon.

FIG. 5B shows how the series circuits of the upper and lower arms are laid out on the insulating substrate 334 made of ceramics having a good thermal conductivity and fixedly disposed on the metal base 304. FIG. 5B also helps understand the function of this structure. In FIG. 5B, the IGBTs 328 and the associated diodes 156 constitute the upper arm circuit while the IGBTs 330 and the associated diodes 166 constitute the lower arm circuit, as already described above.

As shown in FIG. 6, the DC terminal 313 (dotted rectangle in FIG. 6) incorporated in the power module 300 takes a laminated form in which the insulating paper 318 is sandwiched between the negative-polarity connection terminal 316 and the positive-polarity connection terminal 314. The ends of the negative-polarity connection terminal 316 and the ends of the positive-polarity connection terminal 314 are bent in the opposite directions. The bent ends of the negative-polarity connection terminal 316 and the bent ends the positive-polarity connection terminal 314 serve respectively as negative-polarity connection lugs 316a and positive-polarity connection lugs 314a for electrically connecting the power module 300 and the conductor 700 for connecting the capacitor to the external circuit. Since there are two positive-polarity connection lugs 314a (or negative-polarity connection lugs 316a) to be connected with the conductor 700, the average distance between the lugs 314a and the three series circuits of the upper and lower arms becomes almost equal to the average distance between the lugs 316a and the three series circuits of the upper and lower arms. Accordingly, the uneven distribution of parasitic inductance within the power module 300 can be reduced.

Further, as shown in FIG. 6, when the positive-polarity connection terminal 314, the insulating paper 318 and the negative-polarity connection terminal 316 are assembled in a laminated structure, their bent ends, i.e. the connection lugs 314a and 316a, extend in the opposite directions. The ends 318B of the insulating paper 318 are bent along the negative-polarity connection lugs 316a so that a creepage distance may be secured between the positive-polarity connection terminal 314 and the negative-polarity connection terminal 316. If the insulating paper 318 must withstand high temperatures, it may be replaced by a composite sheet of polyimide or meta-aramid fabric and polyester with enhanced trackability. In order to avoid defects such as pinholes and therefore to improve reliability, two insulating sheets are stacked one upon another. In order to prevent the insulating sheet from being broken, the corners are cut with an appropriate radius of curvature, or the burr due to stamping is directed opposed to the insulating sheet so as to prevent the edge of the positive-polarity connection terminal from contacting the insulating paper.

According to this mode of practice of the invention, the insulating sheet was used for the purpose of insulation. Alternatively, however, such insulating paper can be dispensed with and instead the terminals may be coated with insulating material. In order to reduce parasitic inductance, for example, with a power module having a withstand voltage of 600V, the gap length between the positive-polarity and the negative-polarity connection terminals must be 0.5 mm or less, and the thickness of the insulating paper must be half the gap length or less.

In order to reduce parasitic inductance, the positive-polarity connection terminal 314, the insulating paper 318 and the negative-polarity connection terminal 316 are not molded in the resin case 302 (when the resin case 302 is formed, these components are not embedded in the resin.).

In this mode of practice, the positive-polarity connection terminal 314, the insulating paper 318 and the negative-polarity connection terminal 316 are separated from one another and built in a laminated form so that the distance between the positive-polarity connection terminal 314 and the negative-polarity connection terminal 316 can approach the thickness of the insulating paper 318. Consequently, the parasitic inductance can be reduced.

In this mode of practice, the ends of the insulating paper protrude from the lamination of the positive-polarity connection terminal, the insulating paper and the negative-polarity connection terminal so that the creepage distance for insulation between the positive-polarity connection terminal and the negative-polarity connection terminal can be secured.

Figure 11A:
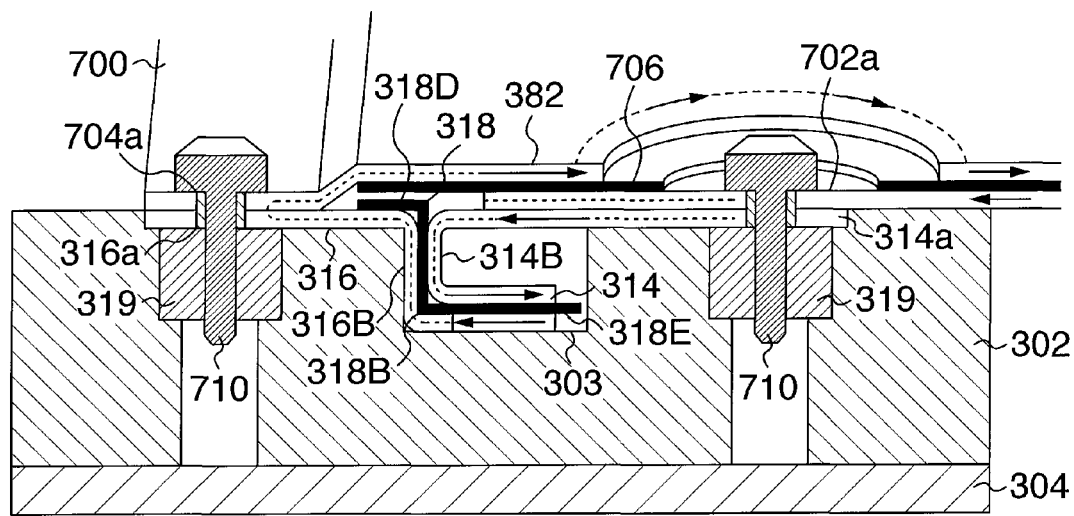
FIG. 11A is a magnified view in cross-section of the connecting portions of the power module and the external connection conductor for capacitor, shown in FIG. 10A.

FIG. 11A shows in cross-section the lamination of the positive-polarity connection terminal, the insulating paper and the negative-polarity connection terminal, in the power module. In order to secure the creepage distance for insulation along the edges of the terminals, a recess 303 for determining the position of the lamination is formed in the resin case of the power module. Further, the negative-polarity connection terminal and the positive-polarity connection terminal have a bend 316B and a bend 314B, respectively. As shown in FIG. 11A, the protruded portion 318E of the insulating paper touches the inner wall of the recess 303 of the resin case, and the position (i.e. horizontal position in the figure) of the lamination is determined by sandwiching the bend 318B of the insulating paper between the bend 314B of the positive-polarity connection terminal 314 and the bend 316B of the negative-polarity connection terminal 316. The positive-polarity connection terminal 314 and the negative-polarity connection terminal 316 are immobilized by means of a bolt 720 so that their positions are completely fixed. In this way, since the insulating paper 318 is not directly fixed, it does not suffer from unnatural stress and therefore its effect of insulation can be prevented from deteriorating.

Figure 11B:
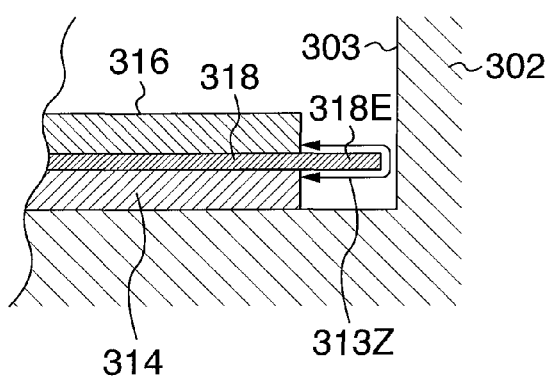
FIG. 11B is a magnification of the recess shown in FIG. 11A, showing the detail of the protruded portion of the insulating paper.

With this structure, the relative positions of the insulating paper, the positive-polarity connection terminal and the negative-polarity connection terminal can be fixed, the protruded portion of the insulating paper can be checked, and the stability of insulation can be secured. FIG. 11B is a magnification of the recess 303 shown in FIG. 11A, showing the detail of the protruded portion 318E of the insulating paper 318. By checking the position of the protruded portion 318E, the creepage distance 313Z for insulation can be secured between the positive-polarity thermal 314 and the negative-polarity connection terminal 316 so that even a thin insulating sheet can provide a reliable insulation against surface creepage.

The power semiconductor elements in the power module are very often covered with silicon gel to enhance insulation effect. If the recess is filled with silicon gel to cover the protruded portion of the insulating paper, not only the reliability of insulation can be improved, but also the length of the protruded portion cam be shortened. With this structure, since the creepage distance 313Z for insulation is placed within silicon gel, the length of the protruded portion 318E of the insulating paper can be shortened, and also the creepage distance 313Z for insulation can be made shorter than the creepage distance for insulation of the protruded portion 318D of the insulating paper (see FIG. 11A) in the vicinity of the negative-polarity connection lugs 316a. Accordingly, the internal structure of the power module can be reduced in size.

Moreover, since the resin case 302 is separated from the positive-polarity connection terminal 314, the insulating paper 318 and the negative-polarity connection terminal 316, the positive-polarity connection terminal 314, the insulating paper 318 and the negative-polarity connection terminal 316 are not exposed to the temperature at and the pressure under, which the resin case 302 is molded. Accordingly, the insulating paper 318 can be prevented from being damaged and also the metal surfaces of the terminals can be prevented from being oxidized.

When a positive-polarity conductor plate 702 and the positive-polarity connection terminal 314 are screwed down and when a negative-polarity conductor plate 704 and the negative-polarity connection terminal 316 are screwed down, the stresses applied to the positive-polarity conductor plate 702 and the negative-polarity conductor plate 704 are not imposed on the positive-polarity connection terminal 314 and the negative-polarity connection terminal 316 since the inserted nuts screwed down by the terminal screw-down bolts 700 absorbs the stresses. Further, since no stress is created in the connecting portions of the internal circuit substrate (indicated at reference numeral 334 in FIG. 7) kept in contact with the positive-plurality connection terminal 314 and the negative-polarity connection terminal 316, the reliability of the connecting portion 159k (see FIG. 7) of the internal substrate can be improved.

Moreover, since the positive-polarity connection terminal 314, the insulating paper 318 and the negative-polarity connection terminal 316 are not molded integrally with the resin case 302 by using sealing resin, the stress due to temperature change in the ambient such as, for example, the stress created due to the thermal expansion of the resin case 302 is not directly imposed on the positive-polarity connection terminal 314, the insulating paper 318 and the negative-polarity connection terminal 316. Accordingly, the reliability of the connecting portion 159k (see FIG. 7) of the internal substrate can be improved.

Figure 8:
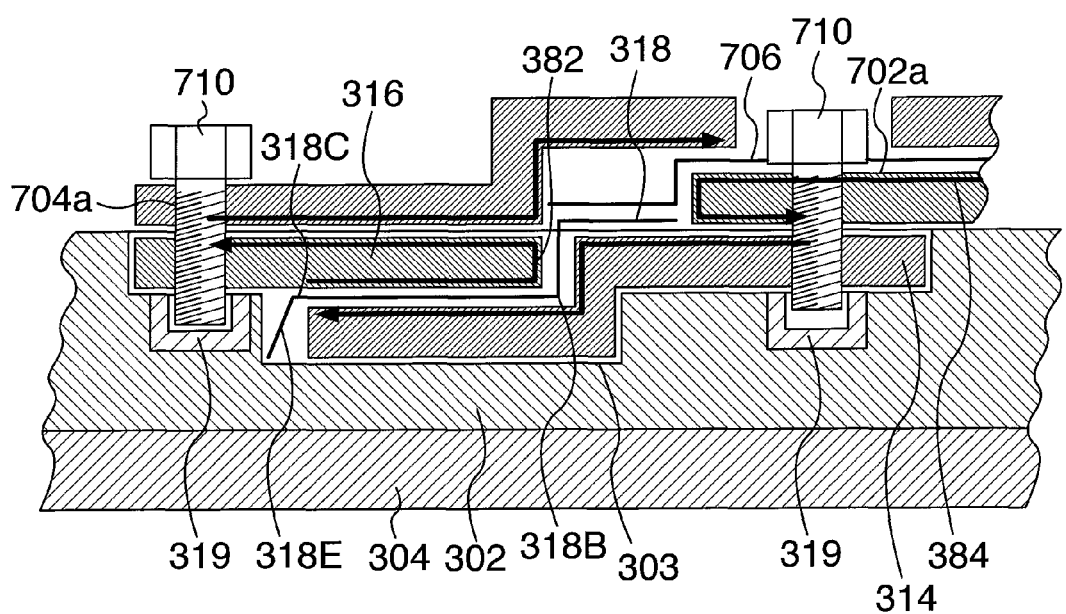
FIG. 8 shows in cross-section the connecting portion in the power module according to a second mode of practice of this invention.

FIG. 8 shows in cross-section the connecting portion in the power module according to a second mode of practice of this invention.

In this mode of practice, a recess 303 for position fixing is formed in a resin case 302; the protruding portion 318E of an insulating paper 318 is provided with a bend 318C; the position of the tip of the protruding portion 318E is fixed by the wall of the recess 303; the positions of the insulating paper 318, a positive-polarity connection terminal 314 and a negative-polarity connection terminal 316 are fixed by fixing the bend 318B of the insulating paper 318 with the bend of the positive-polarity connection terminal 314; and the resulting structure helps secure a high reliability of insulation. Also in this mode of practice, the shape of the negative-polarity connection terminal 316 is especially simplified as compared with the U-shape employed in the first mode of practice. The current switched by the power semiconductor elements is high-frequency current which flows only in the surface of conductor due to the skin effect. Accordingly, the current 382 can only penetrate to the depth of several tens of microns or less in the surface of the terminal having a thickness of 1 mm so that the resulting current path takes a U-shape. For this reason, this mode to practice with the negative-polarity connection terminal which is not of U-shape, can achieve almost the same effect as the first mode of practice described above with the negative-polarity connection terminal of U-shape. Thus, the parasitic inductance can be reduced. Here, FIG. 8 shows a binding bolt 710 and an insert nut 319.

Figure 9:
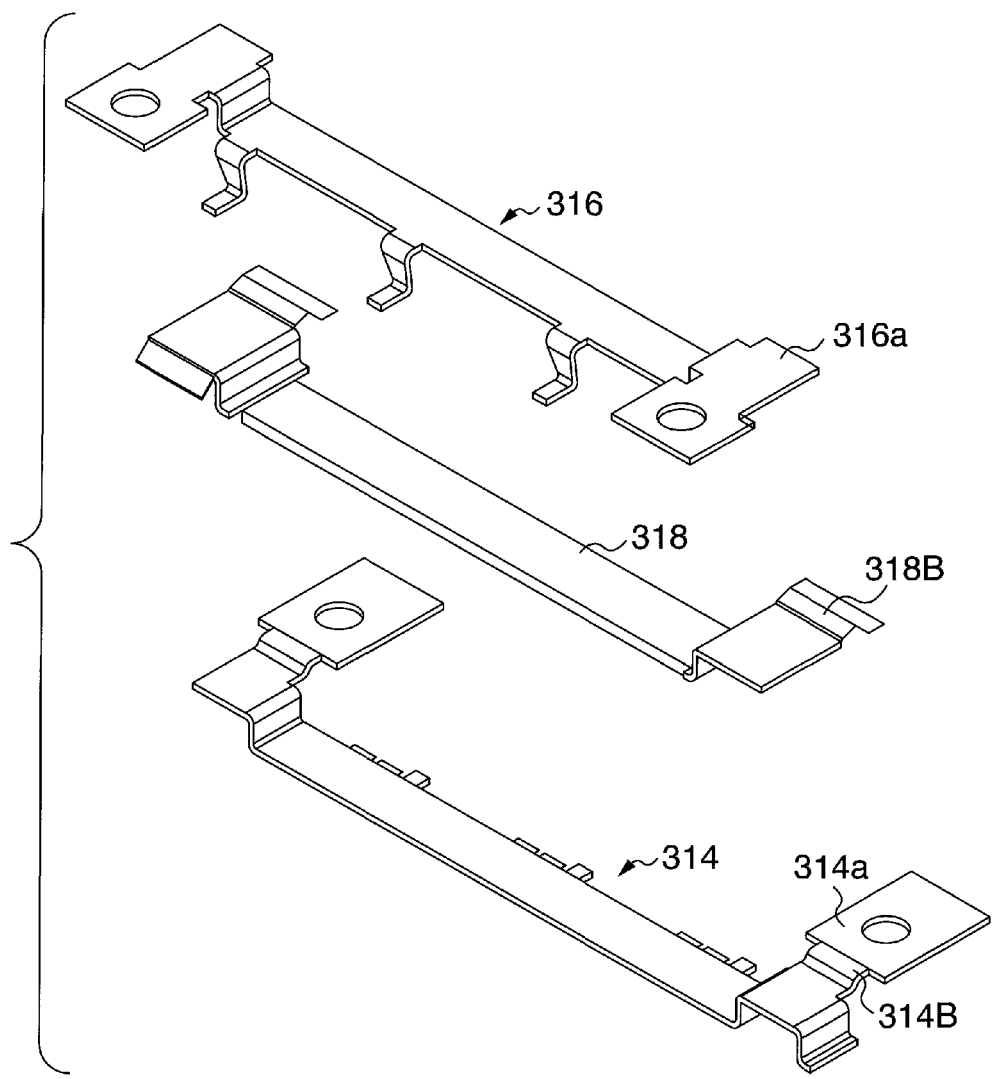
FIG. 9 is a perspective view of the positive- and negative-polarity terminals and the insulating paper according to the second mode of practice.

FIG. 9 is a perspective view of the positive- and negative-polarity connection terminals and the insulating paper according to the second mode of practice. As shown in FIG. 9, since the negative-polarity connection terminal is not in a U-shape, it can be formed by using a steel stamping machine. Accordingly, the precision in manufacturing the terminals can be improved, the deviation of parasitic inductance among the manufactured terminals can be made small, the cost of the terminal can be reduced, and the size of the resulting power module can be reduced since the thickness of the power module can be small.

In this way, this mode of practice makes the stability of insulation and the reduction of parasitic inductance compatible.

As shown in FIG. 6, the positive-polarity connection terminal 314 and the negative-polarity connection terminal 316 respectively have connecting portions 314k and connecting portions 316k for contacting the insulating substrate 334. These connecting portions 314k and 316k extend along the direction of the circuit wiring pattern 334k and have their tips bent to form the surfaces to be kept in contact with the circuit wiring pattern 334k. The connecting portions 314k and 316k are soldered to the circuit wiring pattern 334k, or alternatively they are bonded to each other by using ultrasonic or laser welding.

Figure 10A:
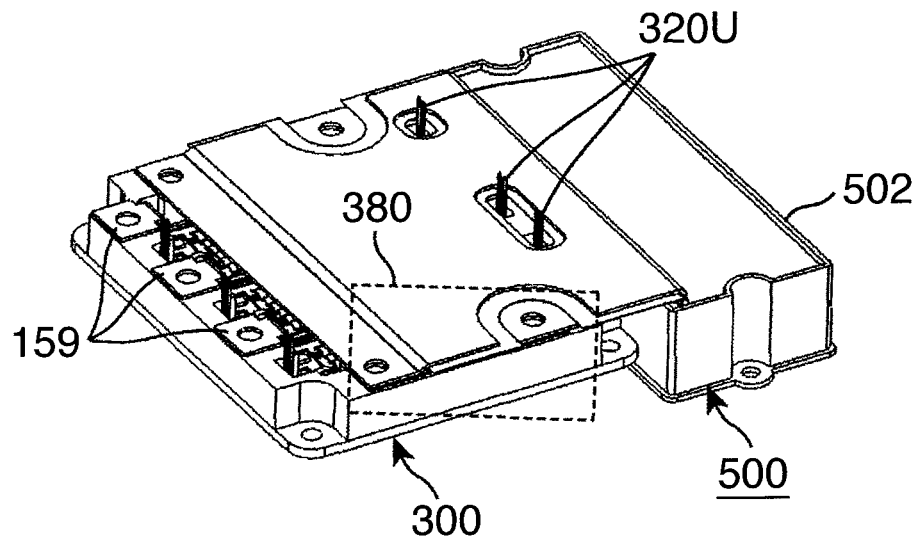
FIG. 10A is a perspective view of the inverter device according to the second mode of practice, where a capacitor module, an external connection conductor for capacitor and a power module are extracted.
Figure 10B:
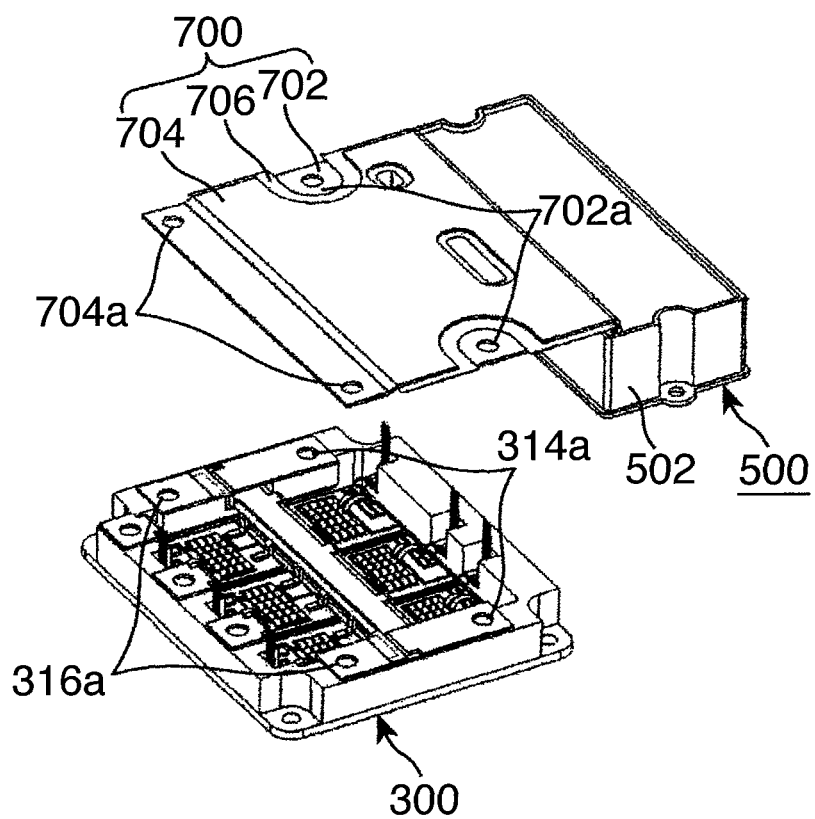
FIG. 10B shows in perspective, disassembled view the external connection conductor for capacitor.

FIG. 10A is a perspective view of the inverter device 200 according to this mode of practice, where a capacitor module 500, an external connection conductor 700 for capacitor and a power modules 300 are extracted. FIG. 10B shows in perspective, disassembled view the external connection conductor 700 for capacitor.

As shown in FIG. 10A, the power module 300 has its three AC terminals 159 disposed in parallel with one another in one direction. On the opposite side of these three AC terminals 159, there are two connection sections through which the power module 300 and the capacitor module 500 are connected with each other. These two electrical connections are made through the external connection conductor 700 for capacitor in the form of flat plate. Here, the reference numeral 502 indicates a capacitor case.

As shown in FIG. 10B, the external connection conductor 700 for capacitor that is connected with the power module 300, is so disposed as to cover the power module 300. Also, as shown in FIG. 10B, the external connection conductor 700 for capacitor consists of a flat positive-polarity conductor plate 702, a flat negative-polarity conductor plate 704 and an insulating sheet 706 sandwiched between them. Since these three members are laminated, the parasitic inductance distributed from the power module 300 to the capacitor module 500 can be reduced.

The driver circuit PCB 22 (see FIG. 4) is disposed over the external connection conductor 700 for capacitor. Accordingly, as shown in FIG. 10B, the external connection conductor 700 for capacitor has its negative-polarity conductor plate 704 disposed on the side of the driver circuit PCB 22 and its positive-polarity conductor plate 702 on the side of the power module 300. With this structure, since the negative-polarity conductor plate 704 kept at a low voltage and the insulating sheet 706 are interposed between the positive-polarity conductor plate 702 kept at a high voltage and the driver circuit PCB 22, the driver circuit PCB 22 can be prevented from getting in touch with the high voltage.

FIG. 11A is a magnified view of the connecting portion 380 (see FIG. 10A) through which the power module 300 is electrically connected with the external connection conductor 700 for capacitor.

As shown in FIG. 11A, the negative-polarity connection lug 316a and the positive-polarity connection lug 314a are so situated as to extend in opposite directions so that the negative-polarity connection lug 316a and the positive-polarity connection lug 314a are electorally connected respectively with the negative-polarity conductor plate 704 and the positive-polarity conductor plate 702 of the external connection conductor 700 for capacitor.

With this structure, the current that flows instantaneously in the vicinity of the negative-polarity connection lug 316a at the time of IGBTs 328 and 330 turning on, is as indicated by an arrow 382 in FIG. 11A. Accordingly, the current indicated by the arrow 382 flows along a U-turn path through the connection portion 704a of the negative-polarity conductor plate 704 and the negative-polarity connection lug 316a. As a result, the magnetic flux generated around the connection portion 704a of the negative-polarity conductor plate 704 cancels the magnetic flux generated around the negative-polarity connection lug 316a so that the parasitic inductance can be reduced.

On the other hand, the current that flows around the connecting portion 702a of the positive-polarity conductor plate 702 is as indicated by an arrow 384. Since the negative-polarity conductor plate 704 is disposed over the connecting portion 702a of the positive-polarity conductor plate 702, the direction of current flowing through the negative-polarity conductor plate 704 is opposite to the direction of current flowing through the connecting portion 702a of the positive-polarity conductor plate 702. Consequently, the magnetic fluxes generated by the two currents flowing in opposite directions cancel each other so that the parasitic inductance around the connecting portion 702a of the positive-polarity conductor plate 702 can be reduced.

Further, as shown in FIG. 11A, the insulating paper 318 and the insulating sheet 706 are so disposed relatively that they overlap in part in the vertical direction. Moreover, when the external connection conductor 700 for capacitor is fixed to the negative-polarity connection lug 316a and the positive-polarity connection lug 314a by means of, for example, a screw, the insulating paper 318 and the insulating sheet 706 are so disposed that they have those portions which do not lie between the external connection conductor 700 for capacitor and the positive-polarity connection lug 314a, that is, those portions which do not experience any stress of compression. With this structure, the insulation around the connecting sections between the positive and negative terminals, that is, the insulation between the positive-polarity connection lug 314a and the negative-polarity conductor plate 704 can be secured.

Now, the explanation of how the parasitic inductance mentioned above affects the switching actions of the IGBTs will be given below.

Description will now be made of the current that flows when one of the IGBTs in the lower arm of the power module 300 is switched on, in reference to FIGS. 12A, 12B and 12C, and 13. FIGS. 12A, 12B and 12C show the relevant portion of the series circuit consisting mainly of the upper-arm IGBT 328 and the lower-arm IGBT 330, in which the dotted arrows indicate the current that flows as time elapses when the lower-arm IGBT 330 turns on.

In FIGS. 12A, 12B and 12C are shown the upper-arm diode 156, the lower-arm IGBT 330, the inductance 192 corresponding to the motor windings in FIG. 2, and parasitic inductance 335 that is the sum of parasitic inductances associated with the power module 300, the capacitor module 500 and the external connection conductor 700 for capacitor. For the sake of simplicity, the power source in FIGS. 12A, 12B and 12C are shown as the battery 136, but in reality it is the capacitor module 500 that is charged by the battery 136.

In the normal operation, there exist two cases that independently occur. Namely, the upper-arm IGBT 328 of the series circuit 150 is conductive with the lower-arm IGBT 330 turned off, or the lower-arm IGBT 330 of the series circuit 150 is conductive with the upper-arm IGBT 328 turned off. It never happens that the upper-arm IGBT 328 and the lower-arm IGBT 330 become conductive simultaneously. Throughout FIGS. 12A, 12B and 12C, the upper-arm IGBT 328 and the lower-arm diode 166 are omitted since no current flows through them when the lower arm turns on.

FIG. 12A shows the case where the lower-arm IGBT 330 is turned off, and the current out of the inductance 192 flows through the diode 156 and returns to inductance 192 as a motor-generator (in the case of returning current 612). FIG. 12B, on the other hand, shows the case (the case of current recovery) where the direction of the current through the diode 156 is opposite to the direction of the current through the diode 156 in the case of returning current in FIG. 12A. FIG. 12C shows the case where the current through the diode 156 is interrupted (turned off).

In the status shown in FIG. 12A, when the lower-arm IGBT 330 turns on, the lower-arm IGBT 330 starts drawing current. As a result, the current flowing through the diode 156 decreases gradually while the current flowing through the inductance 192 remains invariable. Thereafter, when the current flowing through the lower-arm IGBT 330 becomes equal to the current flowing through the inductance 192 (in the initial stage of the status shown in FIG. 12B, i.e. at time t1 in FIG. 13), the current flowing through the diode 156 vanishes. Accordingly, the diode 156 starts being reversely biased (directed from cathode toward anode).

However, since carriers such as holes and electrons are accumulated in the semiconductor of the diode 156, such a reverse bias causes current to start flowing in the reverse direction (from cathode toward anode). As shown in FIG. 12B, the current 614 flows through the diode 156 in the direction reverse to the direction in which current flows through the diode 156 in the case of returning current in FIG. 12A. Consequently, the lower-arm IGBT 330 draws through the parasitic inductance 335 the current greater than that flowing through the inductance 192 (as shown during the time interval (B) in FIG. 13).

Thereafter, the carriers accumulated in the diode 156 are annihilated and then the diode is cut off. At this time, the carriers are annihilated rapidly to decrease the current flowing through the diode rapidly. As a result, a spike voltage is developed across the diode 156 due to the effect of the product of the parasitic inductance L and the rapid change of current dI/dt. If this peak voltage exceeds the withstand voltage of the diode 156, then not only the diode will break down but the IGBT connected in parallel with the diode will also break down since the same voltage is applied thereto. In order to avoid this adverse effect, it is important to decrease the parasitic inductance and therefore to lower the spike voltage.

Figure 13:
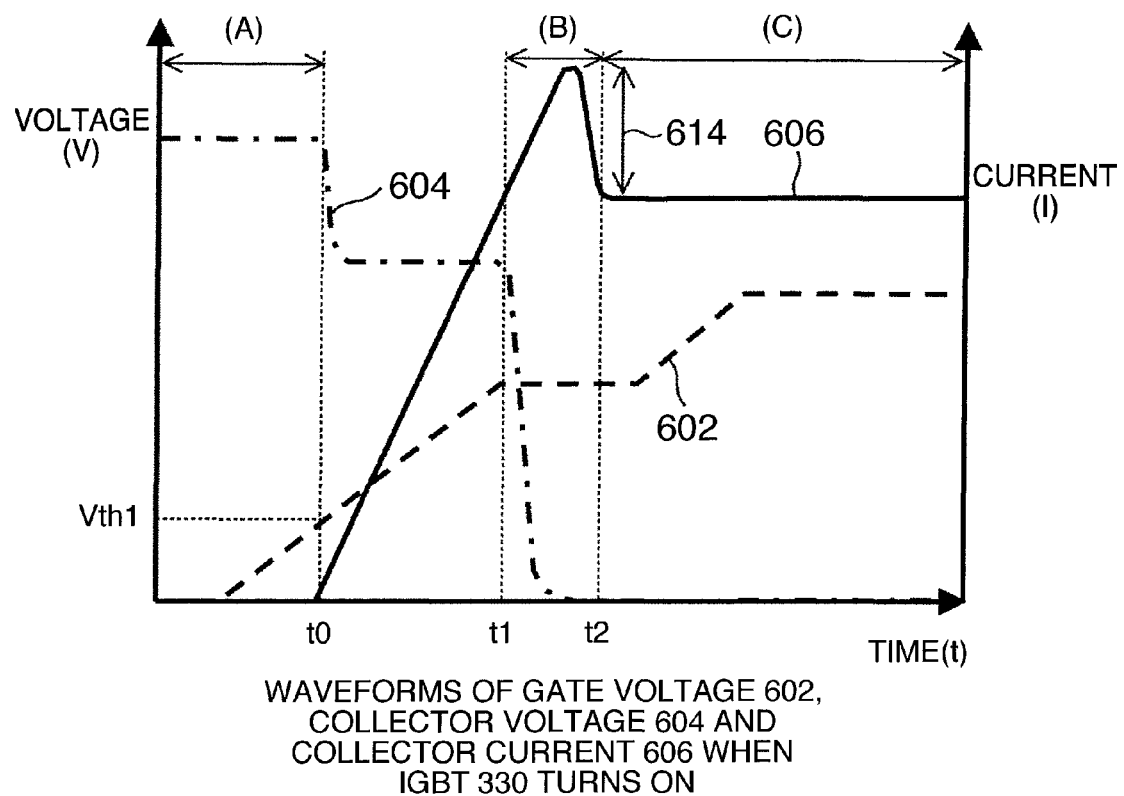
FIG. 13 graphically shows the changes of the collector current (solid curve), the collector voltage (long-and-short dash curve) and the gate voltage (broken curve), of the lower-arm IGBT when it shifts from its non-conductive state to its conductive state as time lapses.

FIG. 13 graphically shows the collector current 606 (solid curve), the collector voltage 604 (long-and-short dash curve) and the gate voltage 602 (broken curve), of the lower-arm IGBT 330 when it shifts from its non-conductive (cut-off)

state to conductive (turned-on) state as time lapses. The regions (A), (B) and (C) in FIG. 13 correspond to FIGS. 12A, 12B and 12C, respectively. In FIG. 13, the waveform of the gate voltage is scaled up.

When the drive voltage is applied to the gate of the lower-arm IGBT 330 which is in the state corresponding to the region (A) in FIG. 13, the drive voltage charges the gate-emitter capacitance and the gate-collector capacitance so that the gate voltage 602 (broken curve) of the lower-arm IGBT 330 increases. The upper-arm diode 156 is drawing the current that is returning from the inductance 192. At the time instant t0 when the gate voltage 602 exceeds the threshold voltage $V_{th1}$ that triggers the conduction of the lower-arm IGBT 330, the collector current 606 of the lower-arm IGBT 330 starts flowing. Accordingly, the returning current through the upper-arm diode 156 starts decreasing.

At this time, the collector voltage 604 (long-and-short dash curve) of the lower-arm IGBT 330 decreases since the voltage surge is inversely developed due to the effect of the product of the change in the current caused by the increase in the collector current 606 (solid curve) and the parasitic inductance 335. Meanwhile, the gate voltage 602 (broken curve) of the lower-arm IGBT 330 continues to increase until the current through the lower-arm IGBT 330 becomes equal to the current through the inductance 192.

After the time point t1, as the returning current flowing through the diode 156 vanishes when the current flowing through the lower-arm IGBT 330 becomes equal to the current flowing through the inductance 192, the voltage across the lower-arm IGBT 330 starts decreasing so that the diode 156 starts being inversely biased. Consequently, the current 614 flows in the direction opposite to the direction of the returning current due to the effect of the carriers accumulated in the diode 156. This is the state shown in the region (B) in FIG. 13. At this time, the gate voltage 602 (broken curve) of the IGBT is clamped since the carriers accumulated in the gate-collector capacitance C are released as discharging current due to the decrease in the collector voltage 604 (long-and-short dash curve) of the lower-arm IGBT 330, so that the increase in the gate voltage is suspended for a time.

The current flowing through the lower-arm IGBT 330 is the superposition of the collector current 600 flowing through the inductance 192 and the current 614. Accordingly, the collector current 606 becomes greater than the collector current 600 by the peak portion 614. On the other hand, when the carriers accumulated in the diode 156 vanish, the current 614 also vanishes. As a result, only the current 600 flowing through the inductance 192 becomes the collector current 606 of the lower-arm IGBT 330.

In the duration from t0 to t2, the collector-emitter voltage of the lower-arm IGBT 330 is high enough to keep the collector current 606 flowing so that thermal energy represented by the product of current and voltage (i.e. turn-on loss) is generated in the lower-arm IGBT 330.

On the other hand, since the current 614 rapidly decreases due to the annihilation of carriers accumulated in the upper-arm diode 156, a spike voltage V (=Ldi/dt) is developed across the diode 156 due to the effect of the product of the change with time of the current (dI/dt) and the parasitic inductance L 335. This spike voltage is applied also to the upper-arm IGBT 328.

One method of reducing the heat generation (i.e. turn-on loss) in the lower-arm IGBT 330 is to shorten the switching time, that is, to perform a quick switching where dI/dt is large, so long as the spike voltage does not exceed the withstand voltages of both the diode and the IGBT. Namely, if the parasitic inductance L is reduced, the quick switching where dI/dt is large can be realized without elevating the withstand voltages of the diode and the IGBT. Accordingly, the turn-on loss can be reduced, which can prevents the temperature of the semiconductor elements from rising with the result that IGBTs and diodes occupying small areas in the semiconductor surface structures become available. This leads to the realization of a low-cost, small-sized semiconductor module and therefore a low-cost, small-sized inverter using such a semiconductor module.

The foregoing description is dedicated to an example of the current flowing through the series circuit of the upper- and lower-arms in which the lower-arm IGBT is turned on. In the method or state in which the inverter circuit 144 is controlled, current may flow through the upper- and lower-arms even while one of the upper- and lower-arm IGBTs is being turned off.

Figure 14A:
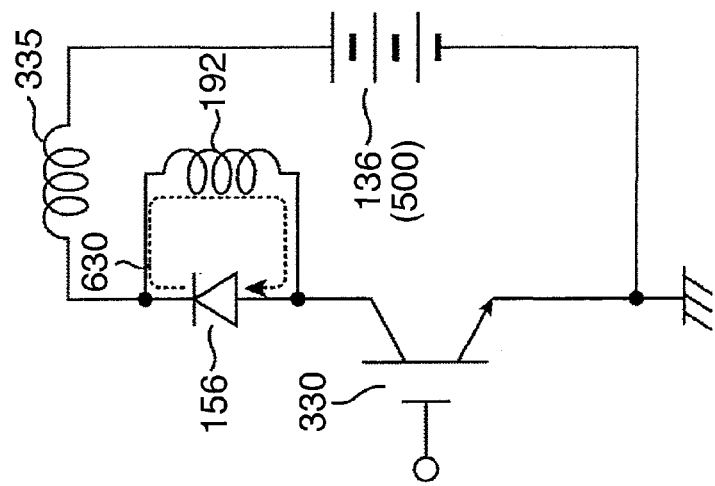
FIGS. 14A, 14B and 14C show the relevant portion of the series circuit consisting mainly of the upper-arm IGBT and the lower-arm IGBT, in which the dotted arrows indicate the current that flows as time elapses when the lower-arm IGBT turns off.
Figure 14B:
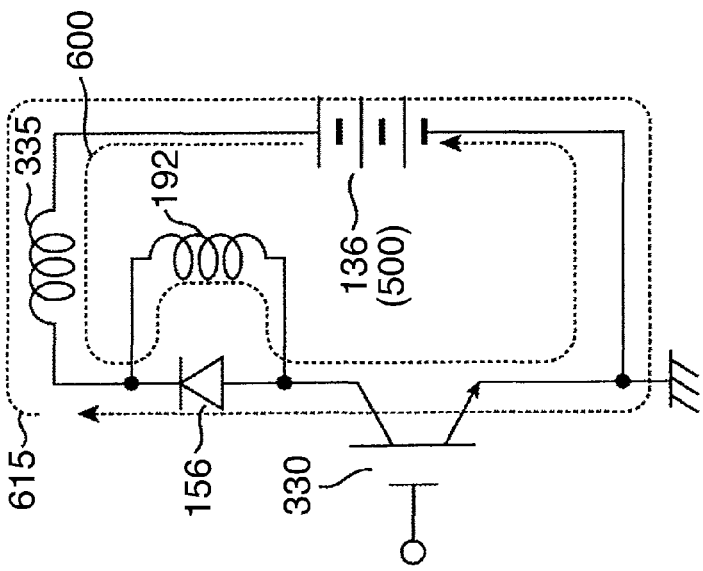
Figure 14C:
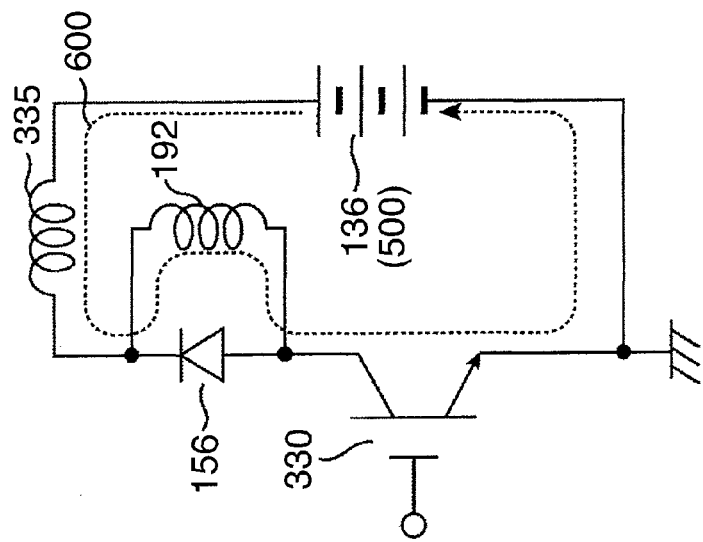
Figure 15:
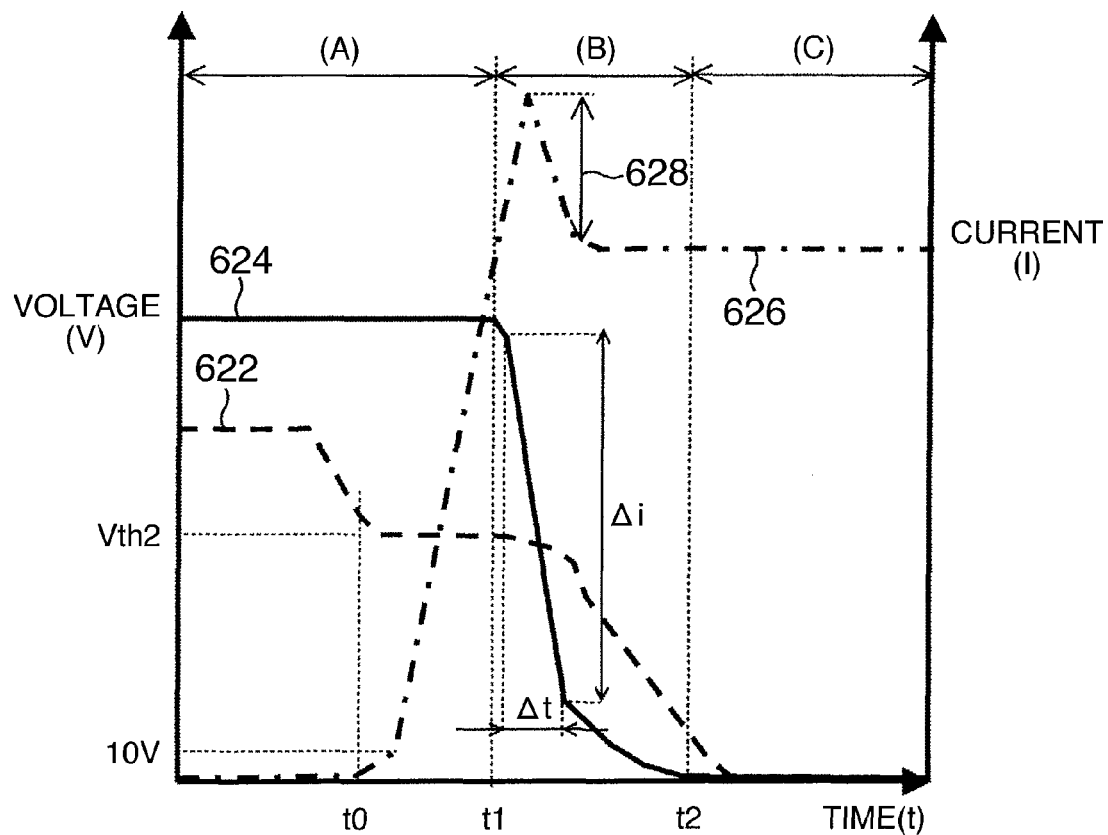
FIG. 15 graphically shows the changes of the gate voltage, the collector current and the collector voltage, of the lower-arm IGBT when it shifts from its conductive state to its non-conductive (turned-off) state as time lapses.

Now, description will be given to an example of an IGBT becoming turned off. FIGS. 14A, 14B and 14C show the relevant portion of the series circuit consisting mainly of the upper- and lower-arm IGBTs, in which the dotted arrows indicate the current that flows as time elapses when the lower-arm IGBT 330 turns off. FIG. 15 graphically shows the gate voltage 622, the collector current 624 and the collector voltage 626, of the lower-arm IGBT 330 when it shifts from its conductive state to its non-conductive (turned-off) state as time lapses. The regions (A), (B) and (C) in FIG. 15 correspond to FIGS. 14A, 14B and 14C, respectively.

FIGS. 14A, 14B and 14C show how current flows through the upper- and lower-arms when the lower-arm IGBT 330 is still conductive (before being turned off), in the course of being turned off, and completely non-conductive (after being turned off), respectively.

As shown in FIG. 14A, while the lower-arm IGBT 330 is conductive, the collector current 600 follows into the inductance 192 from the battery 136 via the parasitic inductance 335. FIG. 14B shows the process in which the lower-arm IGBT 330 is cut off and as the current through the lower-arm IGBT 330 is dwindling, the other current varying inversely as the dwindling current flows through the upper-arm diode 156. For easier understanding, one may consider that the forward collector current 600 through the lower-arm IGBT 330 decreases gradually while the reverse current 615 increases gradually.

The process of turning off the lower-arm IGBT 330 is initiated by discharging the electric charges accumulated in the gate-emitter capacitance of the lower-arm IGBT 330 through the resistor (i.e. gate resistor) provided in the driver circuit 174.

As shown in FIG. 15, as the discharge begins, the gate voltage 622 (dashed curve) starts falling. When the gate voltage 622 (dashed curve) becomes smaller than the threshold value $V_{th2}$, the collector voltage 626 (long-end-short dash curves) begins rising. The collector voltage rises slowly until it reaches about 10 volts and since the gate-collector capacitance is charged up meanwhile, the discharge of the electric charges accumulated in the gate-emitter capacitance is suspended for a time and the fall of the gate voltage 622 (dashed curve) is also suspended. Thereafter, when the collector voltage 626 exceeds 10 V, the gate-collector capacitance decreases rapidly, the current that charges the gate-collector capacitance is reduced, and therefore the discharge of the electric charges accumulated in the gate-emitter capacitance is resumed. Then, the collector voltage 626 (long-end-short dash curve) starts rising rapidly. When it reaches the voltage of the battery, the lower-arm IGBT 330 cannot draw the current from the inductance 192 so that the collector current 624 (solid curve) falls rapidly. At the same time, the region (B) starts where the current returning from the inductance 192 starts flowing through the upper-arm diode 156. At this time, developed across the lower-arm IGBT 330 is the spike voltage (L×dI/dt) 628 generated as the product of the parasitic inductance (L) 335 and the time-rate of change dI/dt for the decreasing collector current (I) 624 (solid curves). This spike voltage 628 is superposed upon the collector voltage 626 (long-end-short dash curves) that has reached the battery voltage so that a voltage higher than the battery voltage is applied across the lower-arm IGBT 330.

Thereafter, the gate voltage 622 decreases in accordance with the time constant defined by the gate-emitter capacitance and the resistor in the driver circuit serving as the discharging path. On the other hand, since the lower-arm IGBT 330 is no longer under the gate voltage control, the collector current 624 (solid curves) of the lower-arm IGBT 330 decreases in accordance with the annihilation of the carriers in the lower-arm IGBT 330.

As soon as the collector current 624 of the lower-arm IGBT 330 has vanished, as shown in FIG. 14C, it is entered where only the returning current 630 from the inductance 192 flows through the upper-arm diode 156.

If the spike voltage 628 exceeds the withstand voltage of the IGBT or the diode even once in the region (B) of FIG. 15, then the IGBT or the diode will break down so that the drive of the motor-generator fails. Further, if the spike voltage is high enough, there will be much stray current through the parasitic capacitance attributable to, for example, the casing. Consequently, such stray current may incur an erroneous operation in not only the inverter device itself but also other devices outside the inverter device.

In order to prevent such failure or malfunction, the IGBTs and the diodes are so designed and controlled that their withstand voltages may not be surpassed by the peak of the spike voltage under the operating condition.

In order to diminish the spike voltage 628 occurring in the region (B) of FIG. 15, dI/dt (Δi/Δt in FIG. 15) must be diminished, or L must be diminished since the spike voltage is determined depending on the product (L×dI/dt) of the parasitic inductance (L) and the time-rate of change (dI/dt) in the collector current (I) 625 (solid curve). In order to diminish dI/dt, the switching time can be prolonged, that is, Δt can be increased to Δt+T, by increasing the resistance value of the gate resistor in the driver circuit that contributes to the time constant for the discharge of electric charges accumulated in the gate-emitter capacitance.

However, if the switching time is prolonged, then increased is the heat generation in the IGBT in switching action (switching loss) that is determined by the product of the current and voltage of the IGBT during the time period for which the collector current and the collector voltage do not vanish simultaneously (for time period from t0 to t2 in FIG. 15). Accordingly, in order to satisfy the thermal requirement in the operation of the IGBT, the area occupied by an IGBT must be increased. This leads to the increase in the amount of silicon to be used, the cost of the resulted IC, the size of the resulted power module, and the amounts of other materials. Thus, it becomes impossible to fabricate a small-sized, low-cost inverter device.

As traditionally well known, heat generation per unit time can be diminished by diminishing the number of switching the IGBT per unit time (carrier frequency). By doing so, however, it becomes difficult to achieve subtle responses in control during the high-speed operation of a motor-generator.

In consideration of these facts, it is better to decrease the parasitic inductance (L) 335 than to reduce dI/dt, for the purpose of decreasing the spike voltage 628. As understood from the review of the paths of the current 614 in FIG. 12A and the current 615 in FIG. 15A, which are both causative of the spike voltage, the parasitic inductance (L) 335 is the sum of all the inductances distributed to all conductors laid out between the power source (capacitor module 500) and the series circuits of the upper- and lower-arms.

In conclusion, it is required to provide the structure of the inverter device according to which parasitic inductances distributed in the power module, the external connection conductor 700 for capacitor, the capacitor module 500 and their connecting portions are all reduced. In the above-described modes of practice of this invention, the structure has been described in which are reduced the overall inductance associated with the connecting portions between the conductor layout on the power module PCB and the power module terminals, the connecting portions between the power module and the DC bus bar, the DC bus bar, the connecting portions between the DC bus bar and the capacitor module, and the capacitor module.

With the structures according to the above-described modes of practice, the parasitic inductance can be easily reduced to 30 nano-henry (nH) or less and further reduced to 20 nH through dimensional optimization. Moreover, at a carrier frequency of 10 KHz, a time-rate of change in current of 5 giga-amperes/s (GA/s) or more can be obtained with conduction current of 500 amperes (A) (Δi in FIG. 15) and cut-off time (Δt in FIG. 15) of 0.1 microsecond (μs) or less. Consequently, the spike voltage can be reduced to 100 V, that is, L×dI/dt=20 nH×5 GA/s=100 V.

Such an inverter device 200 having low loss (heat generation) can be cooled with the cooling water used for cooling the internal combustion engine mounted on a vehicle.

It should be further understood by those skilled in the art that although the foregoing description has been made on embodiments of the invention, the invention is not limited thereto and various changes and modification may be made without departing from the spirit of the invention and the scope of the appended claims.

The invention claimed is:

1. A power module, comprising:
an upper arm circuit unit and a lower arm circuit unit, each including a power semiconductor element;
an insulating substrate with the upper arm circuit unit and the lower arm circuit unit mounted on one surface thereof;
a metal base bonded onto the other surface of the insulating substrate which is opposite to the one surface where the upper and lower arm circuit units are mounted;
a first connection terminal for supplying a high potential to the upper arm circuit unit from outside;
a second connection terminal for supplying a low potential to the lower arm circuit unit from outside;
an insulating sheet interposed between the first connection terminal and the second connection terminal; and
a resin case disposed on the metal base to support the first and second connection terminals,
wherein the first and second connection terminals are flat conductors and laminated with the insulating sheet sandwiched between them;
wherein the insulating sheet extends from one end of the laminated structure so as to secure the creepage distance between the first and second connection terminals;
wherein the resin case is furnished with a recess for containing the laminated structure of the first and second connection terminals and the insulating sheet;
wherein the ends of each of the first and second connection terminals are provided with external connection lugs for connection with the power module, and the insulating sheet extends close to the external connection lugs;

wherein the resin case is provided with screw sections for screwing down the external connection lugs, the screw section being capable of transferring the stress imposed on the external connection lugs to the resin case; and wherein the exposed portion of the insulating sheet that protrudes from the lamination is covered with insulating gel so that the creepage distance of the insulating sheet can be diminished.

2. The power module according to claim 1, wherein the first and second connection terminals and the insulating sheet have bends the tip portions of which are placed in the recess so that the positions of the first and second connection terminals and the insulating sheet can be fixed.

3. A vehicle-mounted inverter incorporating therein the power module and the capacitor module according to claim 1, comprising a laminated bus bar consisting of two conductor plates and an insulating sheet sandwiched therebetween and connecting the power module and the capacitor module electrically, wherein the peripheral ends of the two conductor plates are provided with connecting portions, respectively;

wherein one of the first and second connection terminals of the power module is disposed close to and connected with, one of the two conductor plates of the laminated bus bar; and wherein the laminated bus bar is disposed over one of the first and second connection terminals of the power module when the laminated bus bar and the one of the first and second connection terminals of the power module are electrically connected with each other, so that the insulating sheet of the laminated bus bar overlaps the insulating sheet which is disposed between the connection lugs of the first and second connection terminals.

* * * * *